United States Patent
Maloof

(10) Patent No.: US 11,828,627 B2
(45) Date of Patent: Nov. 28, 2023

(54) INDUCTIVE POSITION SENSORS

(71) Applicant: SENSATA TECHNOLOGIES, INC., Attleboro, MA (US)

(72) Inventor: James M. Maloof, Westwood, MA (US)

(73) Assignee: SENSATA TECHNOLOGIES, INC., Attleboro, MA (US)

(*) Notice: Subject to any disclaimer, the term of this patent is extended or adjusted under 35 U.S.C. 154(b) by 312 days.

(21) Appl. No.: 17/276,364

(22) PCT Filed: Jan. 22, 2021

(86) PCT No.: PCT/US2021/014636
§ 371 (c)(1),
(2) Date: Mar. 15, 2021

(87) PCT Pub. No.: WO2021/150906
PCT Pub. Date: Jul. 29, 2021

(65) Prior Publication Data
US 2023/0053126 A1 Feb. 16, 2023

Related U.S. Application Data

(60) Provisional application No. 62/965,623, filed on Jan. 24, 2020.

(51) Int. Cl.
*G01D 5/20* (2006.01)
*G01D 5/243* (2006.01)
(Continued)

(52) U.S. Cl.
CPC .......... *G01D 5/2073* (2013.01); *G01D 5/243* (2013.01); *G01D 5/35341* (2013.01); *G01D 5/35354* (2013.01); *G01R 33/0017* (2013.01)

(58) Field of Classification Search
CPC .. G01D 5/2073; G01D 5/243; G01D 5/35341; G01D 5/35354; G01D 3/02; G01D 5/2053; G01R 33/0017
See application file for complete search history.

(56) References Cited

U.S. PATENT DOCUMENTS

2002/0089326 A1* 7/2002 Morrison ................. G01B 7/02
324/207.17
2004/0227644 A1* 11/2004 Lin ........................ G01D 5/2073
340/870.3
(Continued)

FOREIGN PATENT DOCUMENTS

GB          2503006 A     12/2013
WO          9719323 A1    5/1997

OTHER PUBLICATIONS

International Search Report and Written Opinion, PCT/US2021/014636, dated May 27, 2021, 11 pages.

*Primary Examiner* — Alvaro E Fortich
(74) *Attorney, Agent, or Firm* — Mark H. Williams

(57) ABSTRACT

Methods and apparatuses to obtain increased performance and differentiation for an inductive position sensor through improvements to the sense element and target design are disclosed. In a particular embodiment, a sense element includes a transmit coil, a first receive coil that includes a first plurality of arrayed loops, wherein two or more of the first plurality of arrayed loops are at least one of phase blended and amplitude arrayed, and a second receive coil that includes a second plurality of arrayed loops, wherein two or more of the second plurality of arrayed loops are at least one of phase blended and amplitude arrayed, and wherein the first receive coil and the second receive coil are phase shifted. The sense element coils are arrayed in several geometries and layouts, and the coil and target geometry are (Continued)

manipulated to compensate for inherent errors in the fundamental design of an inductive position sensor.

20 Claims, 30 Drawing Sheets

(51) Int. Cl.
  *G01D 5/353* (2006.01)
  *G01R 33/00* (2006.01)

(56) References Cited

U.S. PATENT DOCUMENTS

| | | | |
|---|---|---|---|
| 2014/0117980 A1* | 5/2014 | Ely | G01B 7/30 |
| | | | 324/207.17 |
| 2018/0087928 A1* | 3/2018 | Jones | G01D 5/2073 |
| 2019/0195963 A1* | 6/2019 | Qama | H05K 1/165 |

* cited by examiner

```
┌─────────────────────────────────────────────────────────────────────┐
│ Provide a sense element comprising at least one transmit coil; a    │
│ first receive coil that includes a first plurality of arrayed       │
│ loops, wherein two or more of the first plurality of arrayed loops  │
│ are phase-blended; and a second receive coil that includes a        │
│ second plurality of arrayed loops, wherein two or more of the       │
│ second plurality of arrayed loops are phase-blended, and wherein    │
│ the first receive coil and the second receive coil are phase        │
│ shifted 3110                                                        │
└─────────────────────────────────────────────────────────────────────┘
                                  │
                                  ▼
┌─────────────────────────────────────────────────────────────────────┐
│         Drive a transmission signal to the at least one transmit coil│
│                                3120                                 │
└─────────────────────────────────────────────────────────────────────┘
                                  │
                                  ▼
┌─────────────────────────────────────────────────────────────────────┐
│         Detect a first reference signal in the first receive coil   │
│                                3130                                 │
└─────────────────────────────────────────────────────────────────────┘
                                  │
                                  ▼
┌─────────────────────────────────────────────────────────────────────┐
│       Detect a second reference signal in the second receive coil 3140│
└─────────────────────────────────────────────────────────────────────┘
                                  │
                                  ▼
┌─────────────────────────────────────────────────────────────────────┐
│ Determine a position of a conductive target in proximity of the     │
│ sense element based on a change in the first reference signal and   │
│ the second reference signal 3150                                    │
└─────────────────────────────────────────────────────────────────────┘
```

FIG. 31

INDUCTIVE POSITION SENSORS

BACKGROUND

Inductive position sensors provide feedback to the control systems for electric motors. For synchronous motors, this feedback is required in order to calculate the phase currents necessary to obtain the desired torque and achieve maximum motor efficiency.

Inductive position sensors operate on two core principles: induction of electromotive force (EMF) in a wire loop and induction of eddy currents in conductive materials. EMF is induced by changing the magnetic flux through a wire loop. This can be done by either changing the area of the loop within the magnetic field or by changing the strength of the field. Eddy currents are induced by either placing a conductor in a changing magnetic field or by relative motion between a conductor and a magnetic field.

Inductive position sensors may result in inaccurate readings when the signal strength in the sensing coil is weak or has a low signal to noise ratio. While multiple receive coils may be combined to produce a stronger signal, this typically results in a larger form factor. Moreover, dead zones may occur in areas where signal traces intersect. Accordingly, there is a need to compensate for these drawbacks.

SUMMARY OF INVENTION

Embodiments in accordance with the present disclosure are directed to an inductive position sensor having phase blended, arrayed, multiloop inductive coils with layout compensated geometry. The phase blended, arrayed, multiloop inductive coils with layout compensated geometry increase signal strength on receive coils of an inductive position sensor, decrease the number of printed circuit board or printed film layers, provide the purest intended sinusoidal response signal for optimal sensor performance, allow functionality and maintain signal quality in broad range of form factors and application requirements, and decrease susceptibility to sensor and system variable's tolerance ranges and stacks. By increasing the signal strength in the receive coils, the signal to noise ratio may be increased, thresholds for proper signal conditioning can be met, and sensor sensitivity to target position under all application conditions (e.g., airgap and temperature ranges) can be improved.

Embodiments in accordance with the present disclosure increase performance and differentiation for an inductive position sensor, such as those used in electric motor applications, through improvements to the sense element and target design. The sense element coils are arrayed in several manners as described herein. Furthermore, the coil and target geometry are manipulated to compensate for inherent errors in the fundamental concept.

For inductive position sensing, the basic operating principles are used by pairing a sensing element and a conductive target. Used in conjunction, the rotation of the target over the sensing elements provides output signals that can be captured with an application specific integrated circuit (ASIC) and provided to, for example, a vehicle electronic control unit (ECU).

An embodiment in accordance with the disclosure is directed to an inductive position sensor that includes a sense element having at least one transmit coil, a first receive coil that includes a first plurality of arrayed loops, wherein two or more of the first plurality of arrayed loops are phase blended, amplitude arrayed, or both, and a second receive coil that includes a second plurality of arrayed loops, wherein two or more of the second plurality of arrayed loops are phase blended, amplitude arrayed, or both, and wherein the first receive coil and the second receive coil are phase shifted. The sensor also includes a conductive target and an integrated circuit configured to provide a transmission signal to the at least one transmit coil, provide a first reference signal to the first receive coil, provide a second reference signal to the second receive coil, and detect a position of the target based on change in the first reference signal and the second reference signal.

In some embodiments, a particular loop in the first plurality of arrayed loops includes a first trace pattern in a first conductive layer, a second trace pattern in a second conductive layer, and a plurality of vias connecting the first trace pattern and the second trace pattern, and via pads corresponding to vias are located outside of an intended sensing area of the particular loop. In some embodiments, a layout of a trace pattern for a particular loop is biased such that an edge of the trace pattern adjacent an intended sensing area is used as a signal reference. In some embodiments, a trace pattern geometry for the first plurality of arrayed loops and the second plurality particular loops is compensated for a dead zone at an intersection of two loops.

In some embodiments, a particular loop in the first plurality of arrayed loops includes a first trace pattern in a first conductive layer, a second trace pattern in a second conductive layer, and the first conductive layer and the second conductive layer are composed of conductive ink on printed film. In some embodiments, crossovers between trace segments in the first receive coil and the second receive coil occur at natural transition points where conductor traces intersect. In some embodiments, at least the first plurality of arrayed loops are asymmetric.

In some embodiments, the first receive coil and the second receive coil are arranged in a hanging coil layout. In these embodiments, the hanging coil layout may be a grouped hanging coil layout. In these embodiments, the hanging coil layout may be an individually spaced hanging coil layout. In these embodiments, the hanging coil layout may be a split hanging coil layout. In some embodiments, the target is selected to be less than half an electrical period of the sensor.

Another embodiment in accordance with the present disclosure is directed to a sense element for an inductive position sensor, the sense element including at least one transmit coil, a first receive coil that includes a first plurality of arrayed loops, wherein two or more of the first plurality of arrayed loops are phase blended, amplitude arrayed, or both, and a second receive coil that includes a second plurality of arrayed loops, wherein two or more of the second plurality of arrayed loops are phase blended, amplitude arrayed, or both, and wherein the first receive coil and the second receive coil are phase shifted.

In some embodiments, a particular loop in the first plurality of arrayed loops includes a first trace pattern in a first conductive layer, a second trace pattern in a second conductive layer, and a plurality of vias connecting the first trace pattern and the second trace pattern, and via pads corresponding to vias are located outside of an intended sensing area of the particular loop. In some embodiments, a layout of a trace pattern for a particular loop is biased such that an edge of the trace pattern adjacent an intended sensing area is used as a signal reference. In some embodiments, a trace pattern geometry for the first plurality of arrayed loops and the second plurality particular loops is compensated for a dead zone at an intersection of two loops.

In some embodiments, a particular loop in the first plurality of arrayed loops includes a first trace pattern in a first conductive layer, a second trace pattern in a second conductive layer, and the first conductive layer and the second conductive layer are composed of conductive ink on printed film. In some embodiments, crossovers between trace segments in the first receive coil and the second receive coil occur at natural transition points where conductor traces intersect. In some embodiments, at least the first plurality of arrayed loops are asymmetric.

In some embodiments, the first receive coil and the second receive coil are arranged in a hanging coil layout. In these embodiments, the hanging coil layout may be a grouped hanging coil layout. In these embodiments, the hanging coil layout may be an individually spaced hanging coil layout. In these embodiments, the hanging coil layout may be a split hanging coil layout.

Another embodiment in accordance with the present disclosure is directed to a method for an inductive position sensor that includes providing a sense element including at least one transmit coil, a first receive coil that includes a first plurality of arrayed loops, wherein two or more of the first plurality of arrayed loops are phase blended, amplitude arrayed, or both, and a second receive coil that includes a second plurality of arrayed loops, wherein two or more of the second plurality of arrayed loops are phase blended, amplitude arrayed, or both, and wherein the first receive coil and the second receive coil are phase shifted. The method also includes driving a transmission signal to the at least one transmit coil, detecting a first reference signal in the first receive coil, detecting a second reference signal to the second receive coil, placing a conductive target in proximity of the sense element, and detecting a position of the target based on change in the first reference signal and the second reference signal.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF DRAWINGS

FIG. 31 sets forth a flow chart illustrating an example method for an inductive position sensor in accordance with the present disclosure.

DESCRIPTION OF EMBODIMENTS

Figure 1:
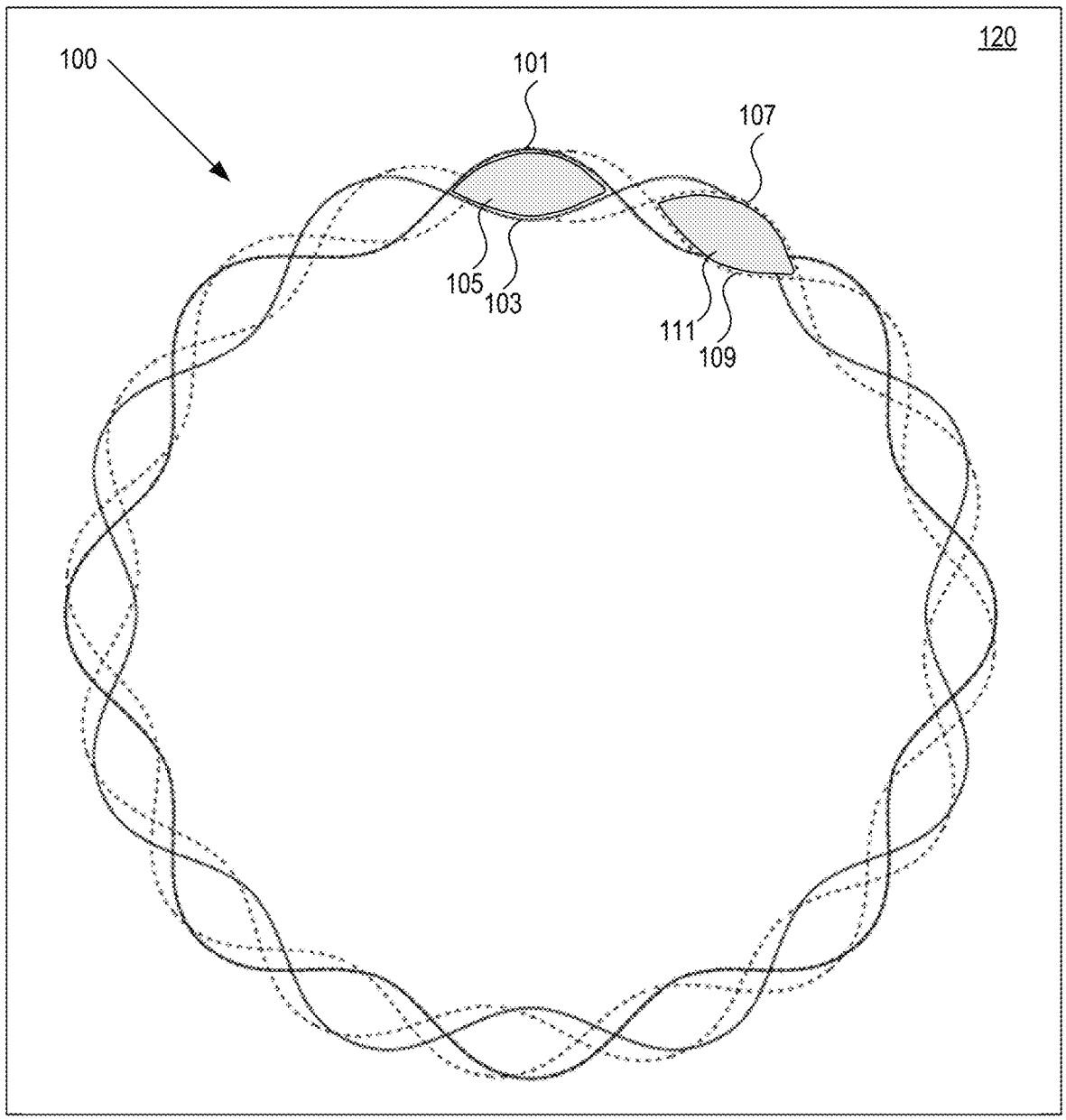
FIG. 1 illustrates an example angularly arrayed receive coil layout in accordance with an embodiment of the present disclosure.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

It will be understood that when an element is referred to as being "connected" or "coupled" to another element, the elements may be directly connected or coupled via one or more intervening elements. If two elements A and B are combined using an "or", this is to be understood to disclose all possible combinations, i.e., only A, only B, as well as A and B. An alternative wording for the same combinations is "at least one of A and B". The same applies for combinations of more than two elements.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

In embodiments in accordance with the present disclosure, an inductive position sensor in a sensing element has output signals that are two phase shifted sinusoidal signals which allow for a ratiometric measurement in order to track angular position by taking the arctan. The sensing element, which is directly connected to an integrated circuit (e.g., an application specific integrated circuit (ASIC)) includes a transmit coil and two receive coils. The transmit coil generates a magnetic field that is received by the receive coils. Driven by the integrated circuit, and in parallel with a capacitor, the transmit coil acts as a LC oscillator circuit. The LC oscillator generates a magnetic field that is the transmitted signal to the receive coils. The polarity of the magnetic field is determined by the direction of the current in the loop. The two receive coils are wire loops, connected to the integrated circuit, that exist within the oscillating magnetic field generated by the transmit coil. The field induces current flow in the coils and an EMF proportional to the area of the magnetic field within each of the wire loops.

In some embodiments, the design of each receive coil creates multiple wire loops in the coil that have opposing EMF generation. Without the target present, the summation of the EMF for a given receive coil is designed to be zero volts. This voltage signal is the input to the integrated circuit. Each coil is designed with a specified target to provide a sinusoidal change in voltage as the target moves from one point over the position sensor to another. In some embodiments, the target is a conductive material that interacts with the magnetic field generated by the transmit coil. When placed above the coil, the field induces eddy currents within the conductive target. The eddy currents then generate a second magnetic field which, according to Lenz's Law, opposes the initial magnetic field that interacted with the target. The result is an attenuated magnetic field in the area below (near) the target. The sensing element and the conductive target together generate a position signal. With the target present over a given wire loop, the attenuated magnetic field results in a change in the EMF generation for the effected loop. The delta is used to track the position of the target. To accomplish this, the two receive coils are identical and phase shifted by 90°. This results in a sine and a cosine output of which the arctan can be taken to calculate the position of the target.

In embodiments in accordance with the present disclosure, arrayed coil loops (e.g., phase blended, multiloop) may be implemented on either linear (X,Y,Z) or angular (θ,R,Z) sensors. When connected in series, receive coils arrayed in the Y (linear) dimension or the R (radial) dimension result in summed sinusoids that are phase aligned to generate a sinusoid of greater amplitude. Multiple coil loop sets that are offset in the Y (linear) dimension or the R (radial) dimension gain the benefit of each individual coil having greater field uniformity to provide a cleaner signal. Receive coil loop sets arrayed in the X (linear) dimension or the θ (angular) dimension result in summed sinusoids that are phase blended to the mean position of each of the coils with a greater amplitude. Coils may be arrayed in the X or θ dimensions by a full electrical period, however the phase blended coils are arrayed by less than a full electrical cycle with the optimal phase separation values being dependent on the number of receive coils and signal transform method (i.e., 2 or 3 phase sinusoids). In various embodiments, angular sensors may be implemented as 360° sensors or arc sensors. As used herein, "phase blended" may refer to angularly arrayed coil loop sets in 360° sensors or arc sensors, or X-arrayed coil loop sets in a linear sensor. As used herein, "amplitude arrayed" may refer to radially arrayed coil loop sets in 360° sensors or arc sensors, or Y-arrayed coil loop sets in a linear sensor.

Exemplary apparatuses and methods for an inductive position sensor in accordance with the present disclosure are described with reference to the accompanying drawings, beginning with FIG. 1. FIG. 1 illustrates an example coil layout of a single receive coil (100) of position sensor that is angularly arrayed (i.e., θ arrayed) in accordance with the present disclosure. In the example of FIG. 1, the receive coil (100) includes a first set of sinusoidal loops having a first sinusoidal trace pattern (101) (e.g., a sine wave) and a second sinusoidal trace pattern (103) that is the reflection of the first sinusoidal trace pattern (101). In some embodiments, sinusoidal trace patterns (101, 103) are formed on same plane (i.e., conductive layer) or different planes of a sense element (120) (e.g., a multilayered PCB or printed film structure). In some embodiments, portions of each sinusoidal trace pattern (101, 103) are formed on one plane while other portions of each sinusoidal trace patterns (101, 103) are formed on a different plane. The sinusoidal trace patterns (101, 103) define coil loops surrounding an intended sensing areas (105) for detecting a magnetic field attenuated by the target when the target is over an intended sensing area (105). When the target is present over the intended sensing area (105), the attenuated magnetic field creates a change in the EMF generation of the affected loop, which is detectable from the signal on the sinusoidal trace patterns (101, 103).

In the example of FIG. 1, the receive coil (100) also includes a second set of sinusoidal loops having a first phase-shifted sinusoidal trace pattern (107) and a second phase-shifted sinusoidal trace pattern (109) that is the reflection of the first phase-shifted sinusoidal trace pattern (107), where the phase-shifted sinusoidal trace patterns (107, 109) are phase-shifted relative to the sinusoidal trace patterns (101, 103). In some embodiments, phase-shifted sinusoidal trace patterns (107, 109) are formed on same plane (i.e., conductive layer) or different planes of the sense element (120). In some embodiments, portions of each phase-shifted sinusoidal trace pattern (107, 109) are formed on one plane while other portions of each phase-shifted sinusoidal trace patterns (107, 109) are formed on a different plane. The sinusoidal trace patterns (107, 109) define coil loops surrounding an intended sensing areas (111) for detecting a magnetic field attenuated by the target when the target is over an intended sensing area (111). When the target is present over the intended sensing area (111), the attenuated magnetic field creates a change in the EMF generation of the affected loop, which is detectable from the signal on the sinusoidal trace patterns (107, 109). By summing the measured EMF generation in the intended sensing areas (105, 111) and correlating the summed measurement to a mean position of the intended sensing areas, an enhanced position signal for the location of the target with respect to the sense element (120) is generated. The enhanced position signal has double the amplitude of a signal derived from a single sense area.

Figure 2:
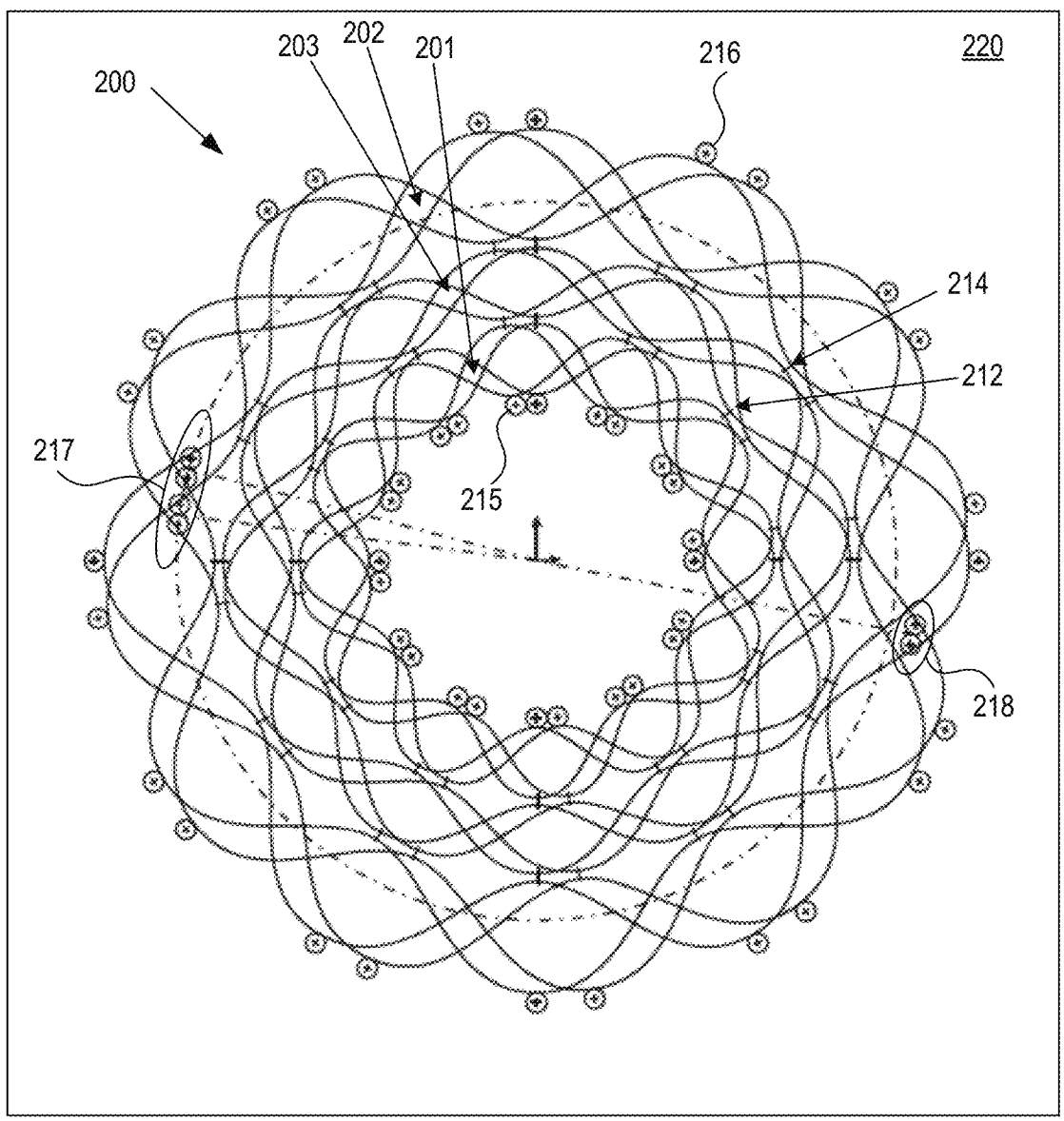
FIG. 2 illustrates an example radially arrayed receive coil layout by full coil width in accordance with an embodiment of the present disclosure.

For further explanation, FIG. 2 illustrates an example coil layout of a single receive coil (200) of an angular sensor that is phase arrayed (angularly arrayed) and radially arrayed (i.e., R arrayed) in accordance with some embodiments of the present disclosure. In the example of FIG. 2, the receive coil (200) includes an angularly arrayed coil that is radially arrayed three times with coil patterns (201, 202, 203) and connected in series. In this example, each coil pattern (201, 202, 203), like the receive coil (100) in FIG. 1, includes a first set of sinusoidal loops having a first sinusoidal trace pattern (e.g., a sine wave) and a second sinusoidal trace pattern that is the reflection of the first sinusoidal trace pattern, as well as a second set of sinusoidal loops having a first phase-shifted sinusoidal trace pattern and a second phase-shifted sinusoidal trace pattern that is the reflection of the first phase-shifted sinusoidal trace pattern, where the phase-shifted sinusoidal trace patterns are phase-shifted relative to the sinusoidal trace patterns. Each aligned loop of the coils (201, 202, 203) are connected by trace segments (212, 214). As the coils are connected in series, the three coils are driven by the same signal output from an integrated circuit. As a result, an enhanced position signal for the location of the target with respect to the sense element (220) can be generated by summing the sinusoids of phase aligned loops, summing the sinusoids that are phase blended, and correlating the resulting sum to a mean position of the phase blended loops.

In some embodiments, portions of each sinusoidal trace pattern in each coil are formed on one plane while other portions of that sinusoidal trace pattern are formed on a different plane such as top and bottom layers of a PCB or various layers of a multilayer PCB. In some examples, an inner ring of vias (215) and an outer ring of vias (216) allow a signal to propagate between layers. Vias (217) may be used for crossovers between positive and negative windings, and vias (218) may be used for crossovers between phase windings.

Figure 3:
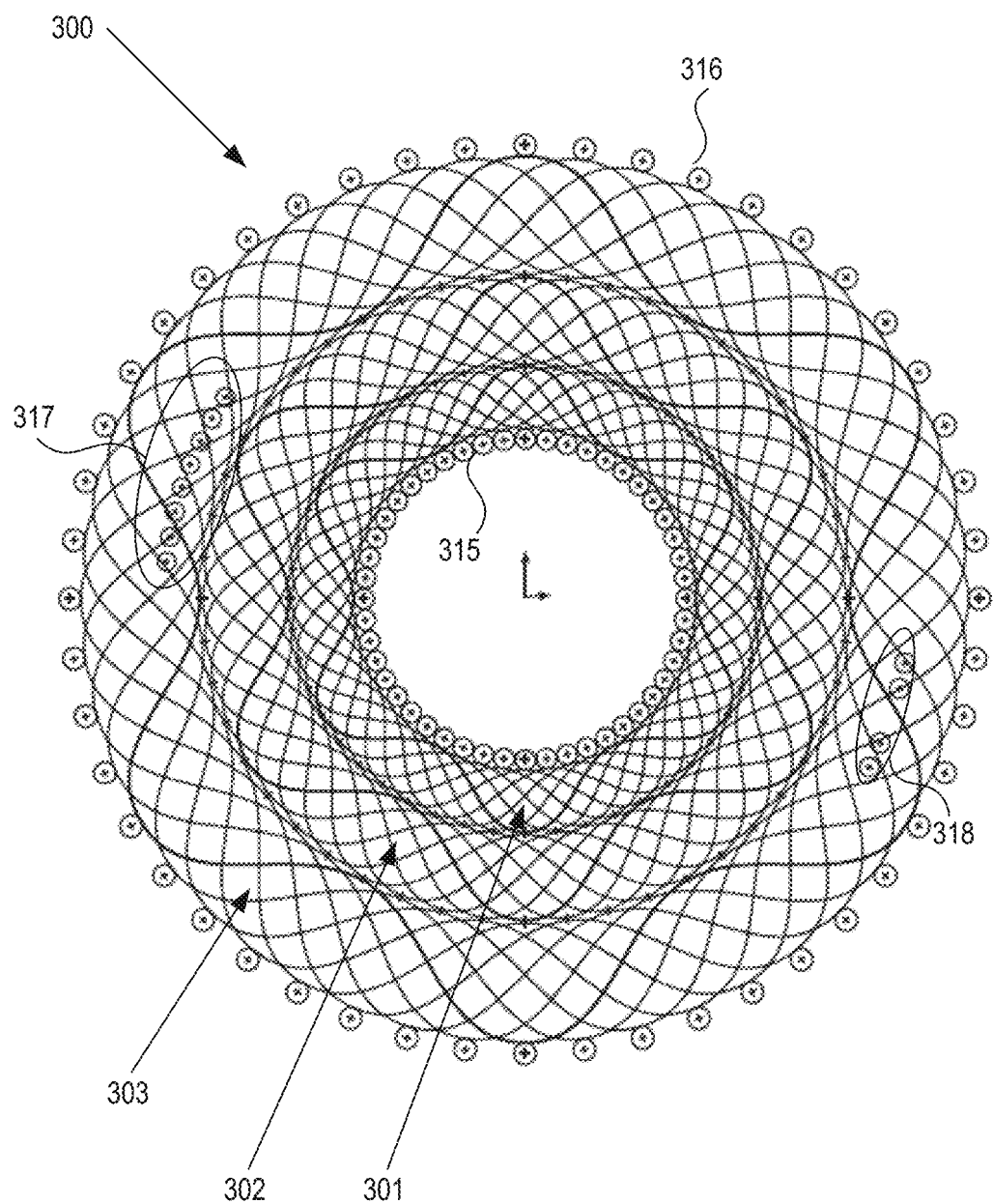
FIG. 3 illustrates an example two signal, angularly and radially arrayed, receive coil layout in accordance with an embodiment of the present disclosure.

For further explanation, FIG. 3 illustrates an example two signal (e.g., sine and cosine) angularly arrayed and radially arrayed receive coil layout (300) in accordance with some embodiments of the present disclosure. The receive coil layout includes three dual coil patterns (301, 302, 303) that are radially arrayed. Each dual coil pattern (301, 302, 303) includes a first angularly arrayed coil corresponding to a first signal (e.g., sine) and a second angularly arrayed coil corresponding to a second signal (e.g., cosine). Each angularly arrayed coil includes a first set of sinusoidal loops and a second set of sinusoidal loops that are phase-shifted with respect to the first set of sinusoidal loops. Because the first angularly arrayed coil and the second angularly arrayed coil are phase-shifted with respect to each other (e.g., 90°, the resulting coil pattern includes two sets of phase blended loops. The first angularly arrayed coils corresponding the first signal in each dual coil pattern (301, 302, 303) are connected in series to form a first receive coil. Phase-aligned loops in the first angularly arrayed coils of each dual coil pattern are amplitude summed. Phase blended loops in the first receive coil are summed and correlated to the mean position of the loops. The second angularly arrayed coils corresponding the second signal in each dual coil pattern (301, 302, 303) are connected in series to form a second receive coil. Phase-aligned loops in the second angularly arrayed coils of each dual coil pattern are amplitude summed. Phase blended loops in the second receive coil are summed and correlated to the mean position of the loops.

In some embodiments, portions of each sinusoidal trace pattern in each receive coil are formed on one plane while other portions of that sinusoidal trace pattern are formed on a different plan, for example, where different planes are top and bottom layers of a PCB or various layers of a multilayer PCB. In some examples, an inner ring of vias (315) and an outer ring of vias (316) allow a signal to propagate between layers. Vias (317) may be used for crossovers between positive and negative windings, and vias (318) may be used for crossovers between phase windings.

Figure 4:
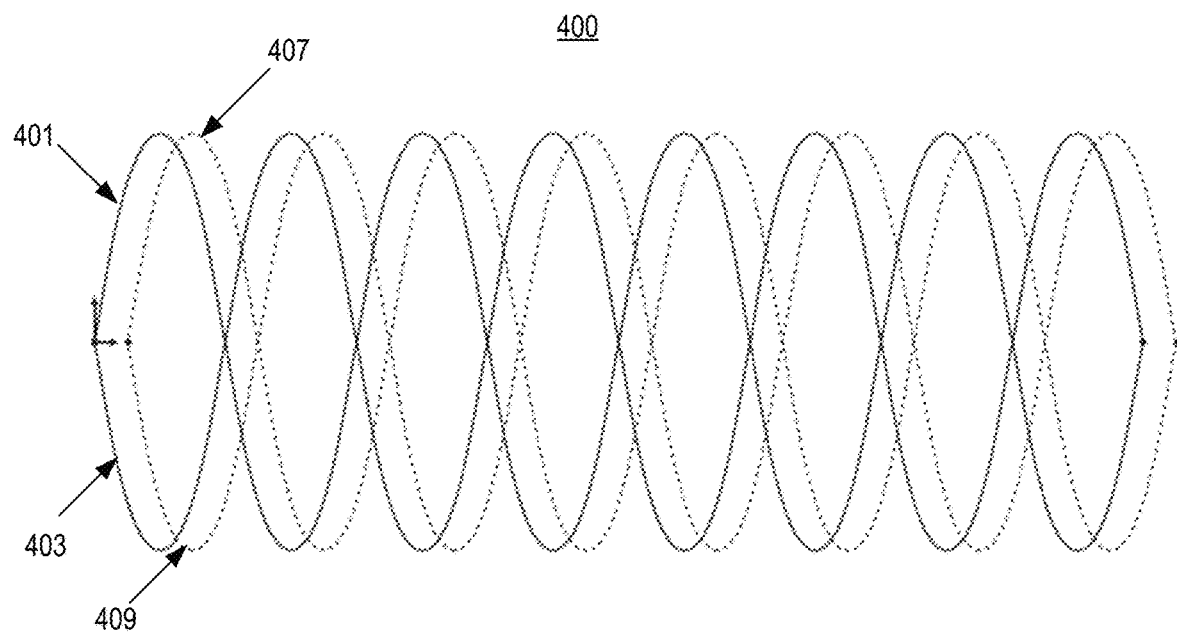
FIG. 4 illustrates an example X arrayed linear receive coil layout in accordance with an embodiment of the present disclosure.

For further explanation, FIG. 4 illustrates an example X arrayed linear receive coil layout (400) in accordance with some embodiments of the present disclosure. The example receive coil layout (400) shows a single receive coil that includes a first set of sinusoidal loops having a first sinusoidal trace pattern (401) (e.g., a sine wave) and a second sinusoidal trace pattern (403) that is the reflection of the first sinusoidal trace pattern (401). The receive coil layout (400) also includes a second set of sinusoidal loops having a first phase-shifted sinusoidal trace pattern (407) and a second phase-shifted sinusoidal trace pattern (409) that is the reflection of the first phase-shifted sinusoidal trace pattern (407) (both shown in dashed lines for clarity), where the phase-shifted sinusoidal trace patterns (407, 409) are phase-shifted relative to the sinusoidal trace patterns (401, 403).

Figure 5:
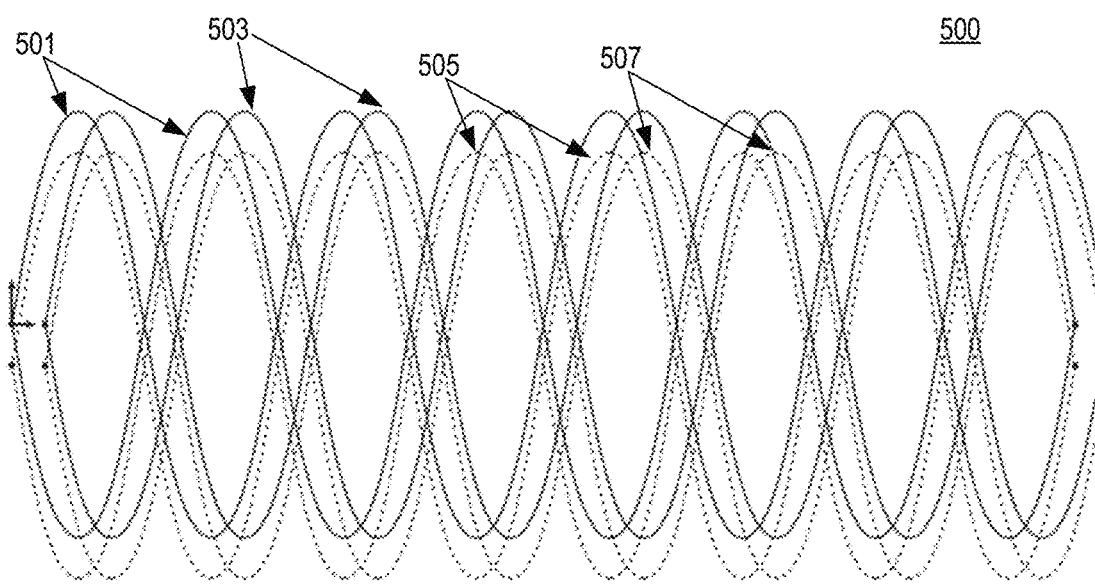
FIG. 5 illustrates an example X and Y arrayed linear receive coil layout in accordance with an embodiment of the present disclosure.

For further explanation, FIG. 5 illustrates an example X and Y arrayed linear receive coil layout (500) in accordance with some embodiments of the present disclosure. The example receive coil layout (500) shows a single receive coil that includes a first set (501) of loops formed from a sinusoidal trace pattern (e.g., a sine wave) and its reflection. The receive coil layout (500) also includes a second set (503) of loops that are phase-shifted relative to the first set (501) of loops. The receive coil layout (500) also includes a third set (505) of loops formed from another sinusoidal trace pattern (e.g., a sine wave) and its reflection. The receive coil layout (500) also includes a fourth set (507) of loops that are phase-shifted relative to the third set (505) of loops. The first and second set of sinusoidal loops are Y-arrayed with respect to the third and fourth set of sinusoidal loops (shown in dashed lines for clarity).

Figure 6A:
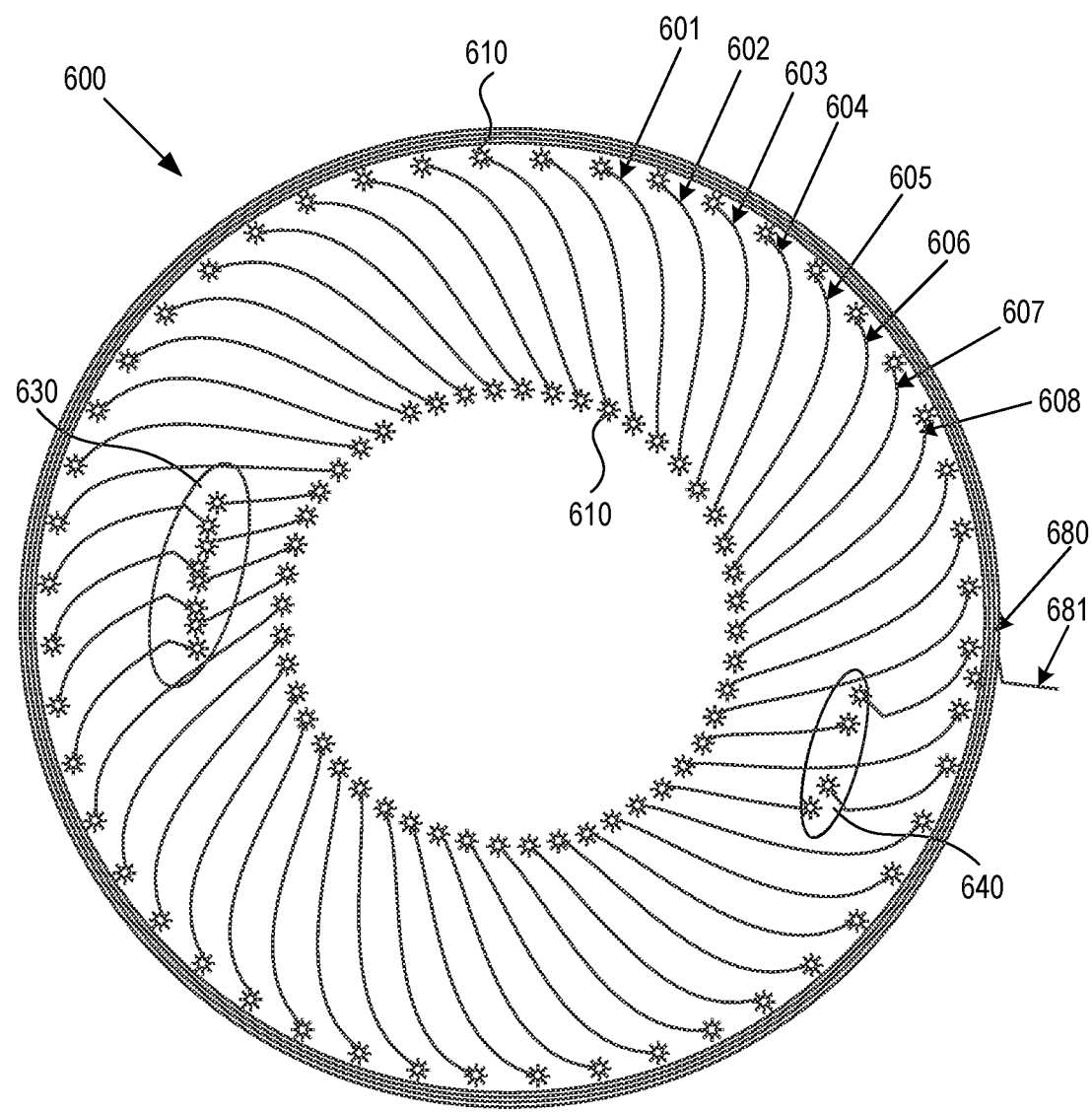
FIG. 6A illustrates an example conductor layout for a first coil layer of a receive coil in accordance with an embodiment of the present disclosure.
Figure 6B:
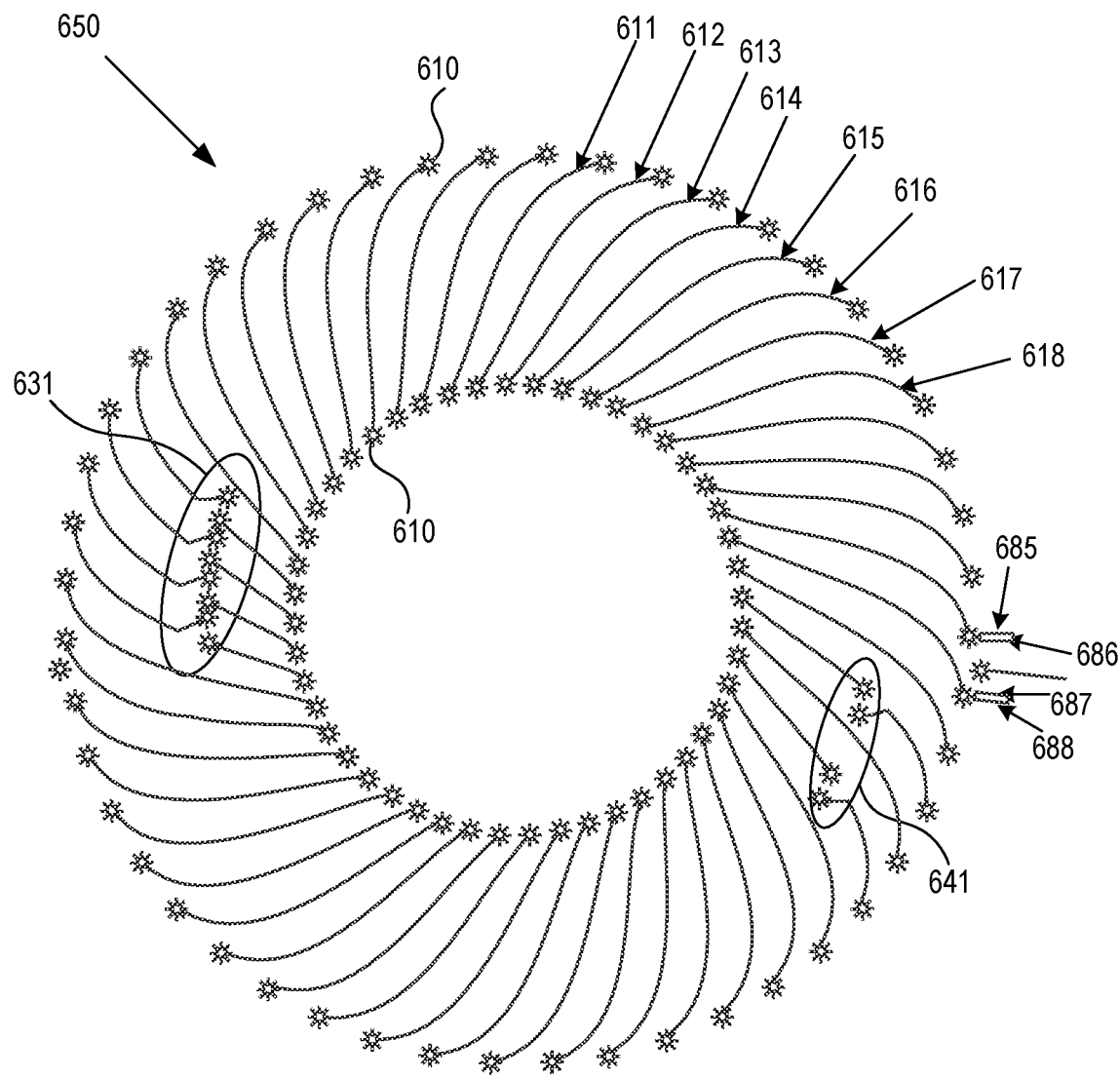
FIG. 6B illustrates an example conductor layout for a second coil layer of the receive coil of FIG. 6B in accordance with an embodiment of the present disclosure.

For further explanation, FIG. 6A illustrates a coil layout (600) for a top layer of a dual coil pattern for two receive coils corresponding to distinct signal patterns (e.g., sine and cosine) and FIG. 6B illustrates a coil layout (650) for a bottom layer of a dual coil pattern for two receive coils corresponding to the distinct signal patterns, in accordance with some embodiments of the present disclosure. For example, the coil layout (600) may be disposed on a top layer of a PCB and coil layout (650) may be disposed on a bottom layer of the PCB. The coil layout (600) includes a transmit signal input line (681) and a transmit coil (680) that loops around a dual receive coil layout described below.

In FIG. 6A, the coil layout (600) includes a first receive signal coil pattern that is angularly arrayed and a second receive coil that is also angularly arrayed, where the first receive coil and the second receive signal coil pattern are themselves angularly arrayed with respect to each other. The coil layout (600) includes sets of trace segments that correspond to portions of sinusoidal patterns. In the example of FIG. 6A, trace segment (601) corresponds to a portion of a first sinusoidal pattern (e.g., sine) of the first signal, trace segment (603) corresponds to a portion of a first sinusoidal pattern (e.g., cosine) of the second signal, trace segment (602) corresponds to a portion of a second sinusoidal pattern (e.g., phase-shifted sine) of the first signal that is phase-shifted with respect to the first sinusoidal pattern of the first signal, and trace segment (604) corresponds to a portion of a second sinusoidal pattern (e.g., phase-shifted cosine) of the second signal that is phase-shifted with respect to the first sinusoidal pattern of the second signal. The adjacent set of trace segments (605, 606, 607, 608) follow a reverse direction of the signal patterns respectively corresponding to trace segments (601, 602, 603, 604). Forward direction sets of trace segments (601, 602, 603, 604) alternate with reverse direction sets of trace segments (605, 606, 607, 608) around the sensor in that in that each sinusoidal pattern loops around the sensor before reversing direction to form a reflection of the forward direction pattern. Each sinusoidal pattern reverses direction at a natural junction point (e.g., where the current in the signal reverses). In the example, of FIG. 6A, the sinusoidal patterns (e.g., sine, cosine, phase-shifted sine, phase-shift cosine) reverse direction at via pairs (630). Similarly, initial signal patterns (e.g., sine and cosine) transition to phase-shifted signal patterns (e.g., phase-shift sine and phase-shifted cosine) at via pairs (640).

Trace segments in the coil layout (600) of FIG. 6A connect to trace segments in the coil layout (650) of FIG. 6B through vias (610) between the top layer in FIG. 6A and the bottom layer in FIG. 6B. To minimize crossovers between signals and phases of signals, trace segments corresponding to portions of the sinusoidal pattern with increasing amplitude are disposed on one layer and trace segments corresponding to portions of the sinusoidal pattern with decreasing amplitude are disposed on a different layer, with pass through vias connecting the increasing portions to the decreasing portions. For example, trace segments (601, 602, 603, 604) in FIG. 6A connect to trace segments (611, 612, 613, 614) in FIG. 6B and trace segments (605, 606, 607, 608) in FIG. 6A connect to trace segments (615, 616, 617, 618) in FIG. 6B.

In the example coil layout (650) of FIG. 6B, like the example coil layout (600) of FIG. 6A, trace segment (611) corresponds to a portion of a first sinusoidal pattern (e.g., sine) of the first signal, trace segment (613) corresponds to a portion of a first sinusoidal pattern (e.g., cosine) of the second signal, trace segment (612) corresponds to a portion of a second sinusoidal pattern (e.g., phase-shifted sine) of the first signal that is phase-shifted with respect to the first sinusoidal pattern of the first signal, and trace segment (614) corresponds to a portion of a second sinusoidal pattern (e.g., phase-shifted cosine) of the second signal that is phase-shifted with respect to the first sinusoidal pattern of the second signal. The adjacent set of trace segments (615, 616, 617, 618) follow a reverse direction of the signal patterns respectively corresponding to trace segments (611, 612, 613, 614). Forward direction sets of trace segments (611, 612, 613, 614) alternate with reverse direction sets of trace segments (615, 616, 617, 618) around the sensor in that in that each sinusoidal pattern loops around the sensor before reversing direction to form a reflection of the forward direction pattern. Each sinusoidal pattern reverses direction at a natural junction point (e.g., zero amplitude). In the example, of FIG. 6B, the sinusoidal patterns (e.g., sine, cosine, phase-shifted sine, phase-shift cosine) reverse direction at via pairs (631). Similarly, initial signal patterns (e.g., sine and cosine) transition to phase-shifted signal patterns (e.g., phase-shift sine and phase-shifted cosine) at via pairs (641).

In the example of FIG. 6B, the coil layout (650) also includes the input and output lines (685, 686) for the first receive coil, the input and output lines (687, 688) for the second receive coil, and the output line for the transmit coil (680). When superimposed, trace segments in coil layout (600) of FIG. 6A and trace segments in coil layout (650) in FIG. 6B form four sinusoidal patterns that loop around the sensor for a two signal sense element. In such a configuration, two phases of each signal are blended to improve the signal to noise ratio (SNR). The arctan of the sine and cosine receive signals may be calculated to determine the position of a target over the sense element.

Figure 7A:
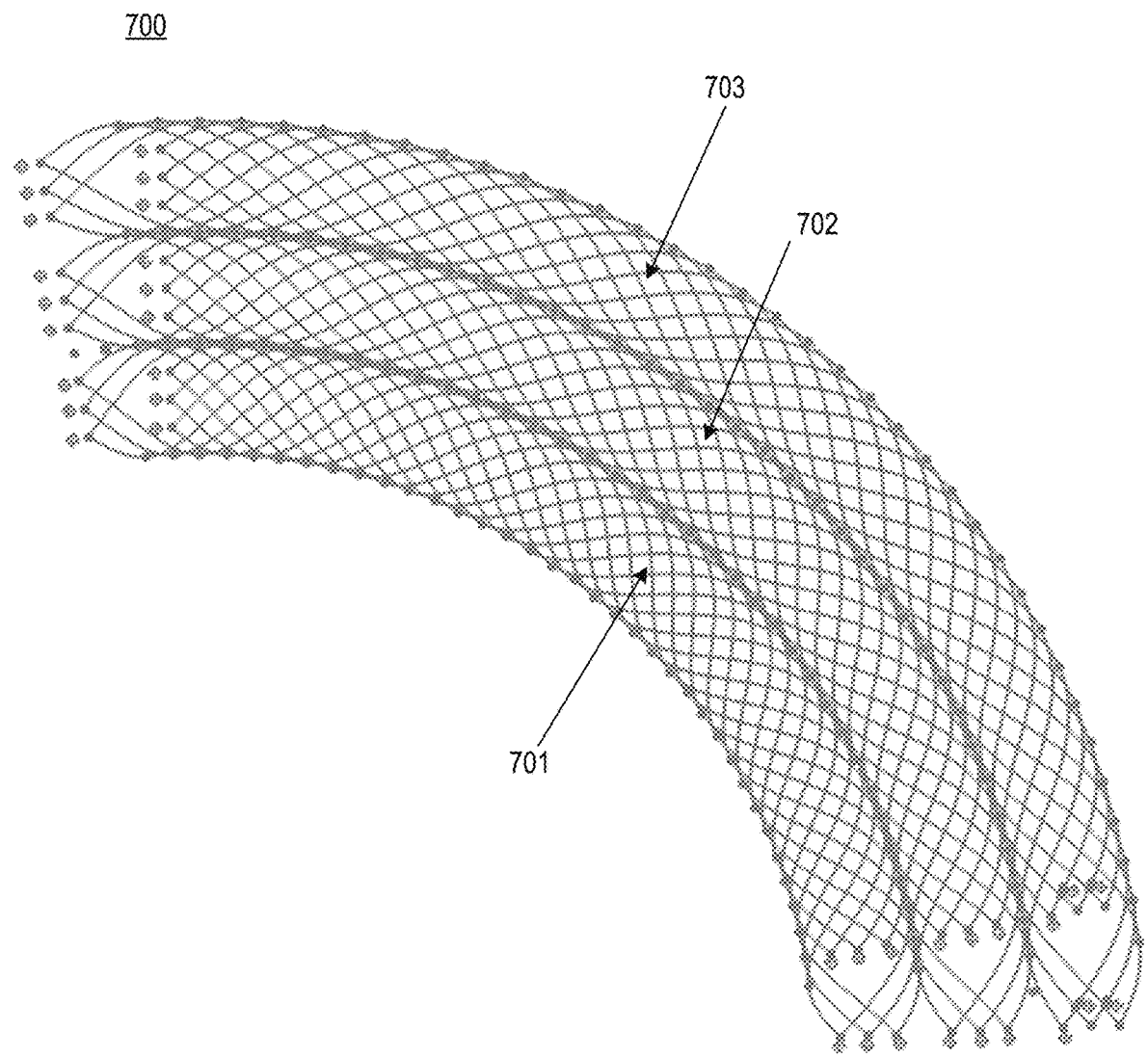
FIG. 7A illustrates another example conductor layout in accordance with an embodiment of the present disclosure.
Figure 7B:
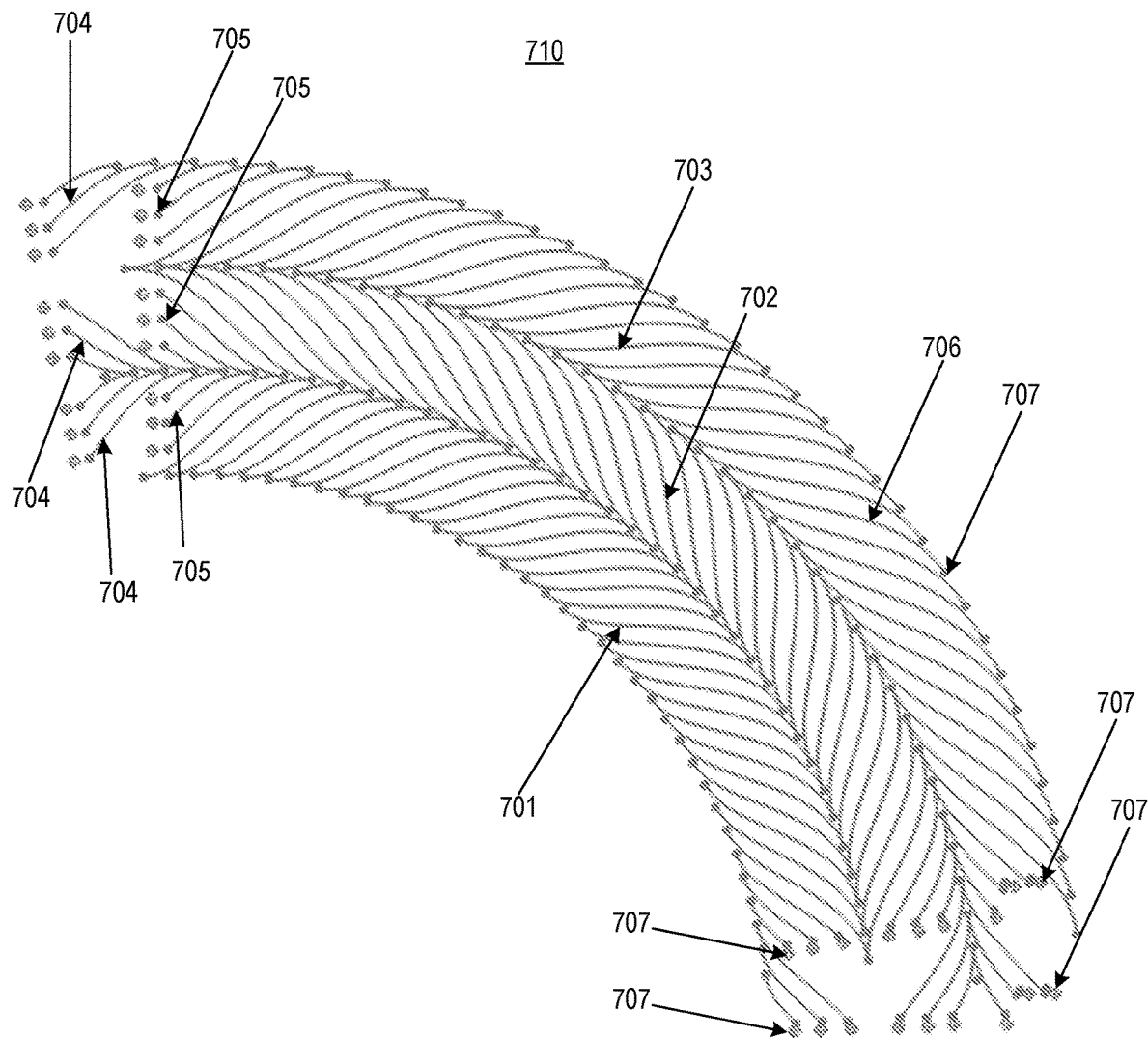
FIG. 7B illustrates a first layer of the coil layout of FIG. 7A in accordance with an embodiment of the present disclosure.
Figure 7C:
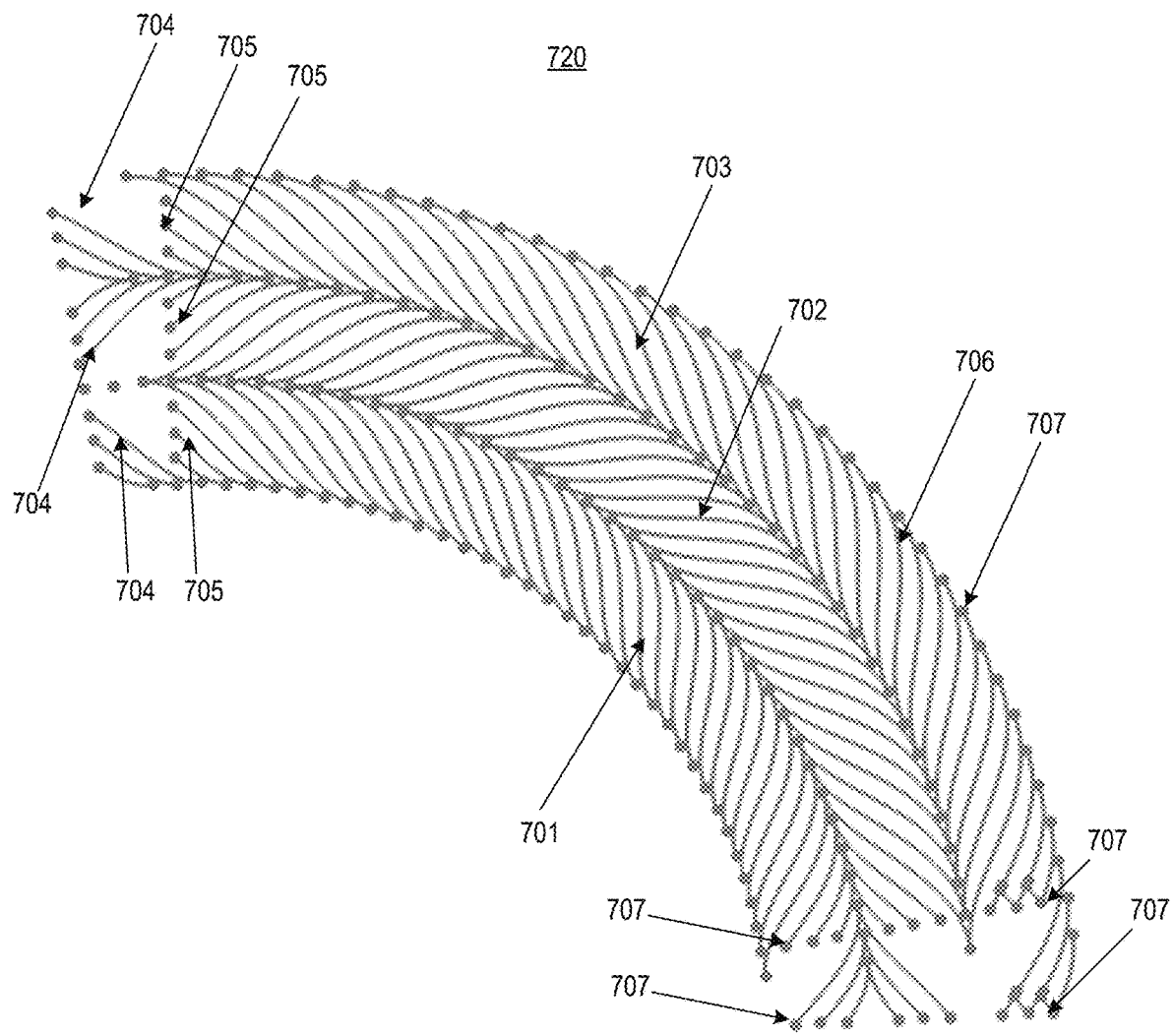
FIG. 7C illustrates a second layer of the coil layout in accordance with an embodiment of the present disclosure.

For further explanation, FIG. 7A illustrates an example coil layout (700) for an arc sensor, FIG. 7B illustrates a first layer (710) of the coil layout (700), and FIG. 7C illustrates a second layer (720) of the coil layout (700), in accordance with some embodiments of the present disclosure. In some examples, the first layer (710) is formed on a top layer of a sense element PCB and the second layer is formed on the bottom layer of the PCB. The coil layout (700) includes three radially arrayed coil patterns (701, 702, 703) that are connected in series. Each coil pattern includes two signal patterns (704, 705) corresponding to two signals (e.g., sine and cosine). Each signal pattern is angularly-arrayed with three replicates. Trace segments (706) for the signal patterns on one layer (710) convey the signal in opposing directions (i.e., outward vs. inward or increasing vs. decreasing) on the other layer (720). Vias (707) are used to pass a signal from the first layer (710) to the second layer (720) forming a signal pattern on first layer (710) and a reflection of the signal pattern on the second layer (720) to create a sinusoidal signal pattern.

In some embodiments in accordance with the present disclosure, coil loops may also be arrayed in the Z axis, which is normal to the plane of the transmit coil. Coil loops may be arrayed in the Z axis by stacking layers of the medium used for placing the conductors if the conducting segments are isolated from one another by an insulating layer. By way of example and not limitation, stacking coil loops may be carried out by using multilayer PCBs with offset via positioning, multilayer PCBs with hidden vias on alternating layers, or by using conductive ink on printed film with printed insulation layers between crossover segments. Minimizing the thickness of the overall coil stack ensures a more uniform magnetic field throughout the thickness. In some embodiments, the use of conductive ink on printed film minimizes the thickness of the stack and therefore provides the most optimal magnetic field.

Figure 8:
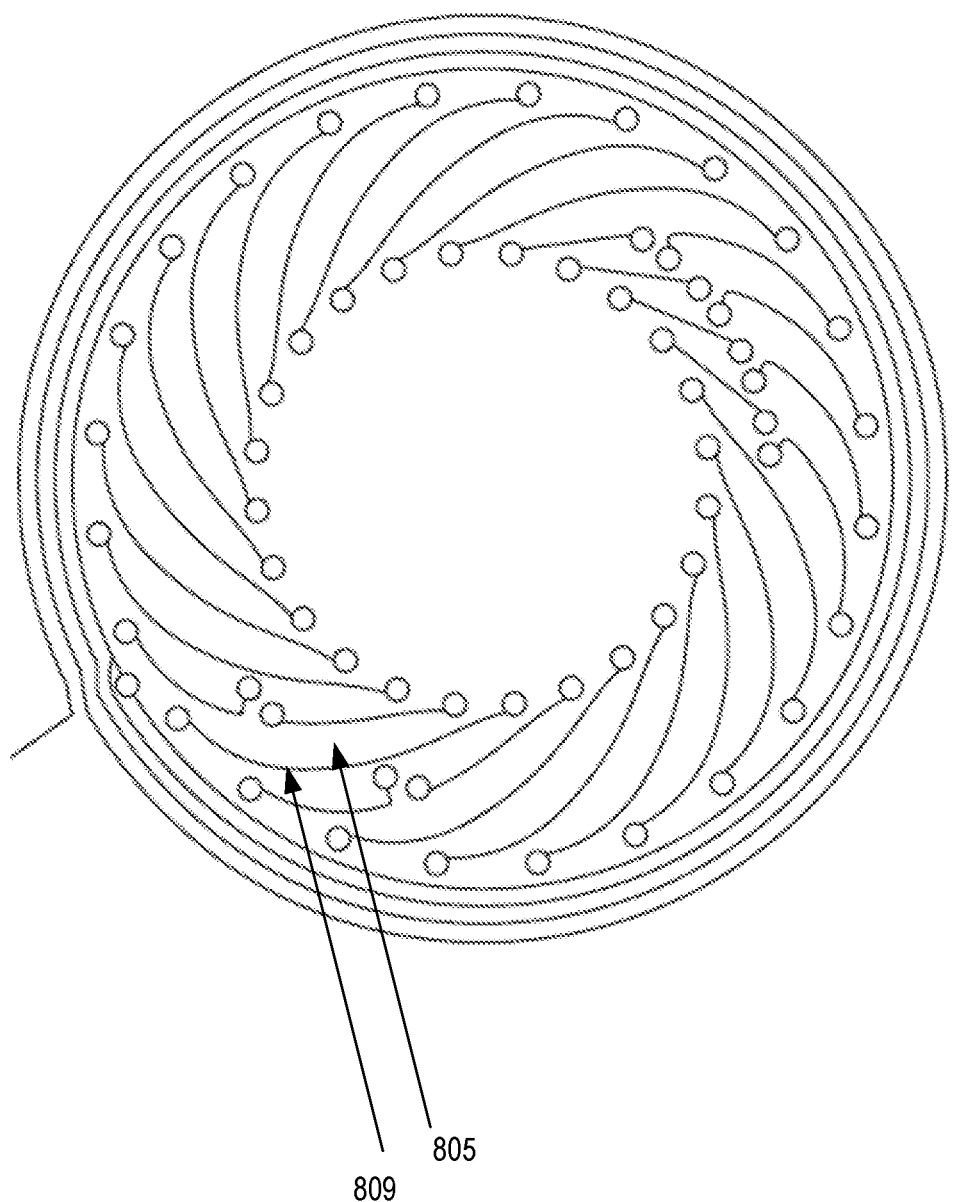
FIG. 8 illustrates an example conductor layout in accordance with an embodiment of the present disclosure.

For further explanation, FIG. 8 illustrates a detailed view of an example layer of a coil layout (800) in accordance with some embodiments of the present disclosure. The coil layout (800) is biased such that the edge, not the centerline, of the conductive trace (809) adjacent to the intended sensing area (805) is the reference used to generate the signal output. In other words, the edges of the conductive traces align with the sinusoidal signal that defines the sensing area rather than the center of the conductive traces aligning the sinusoidal signal.

Figure 9:
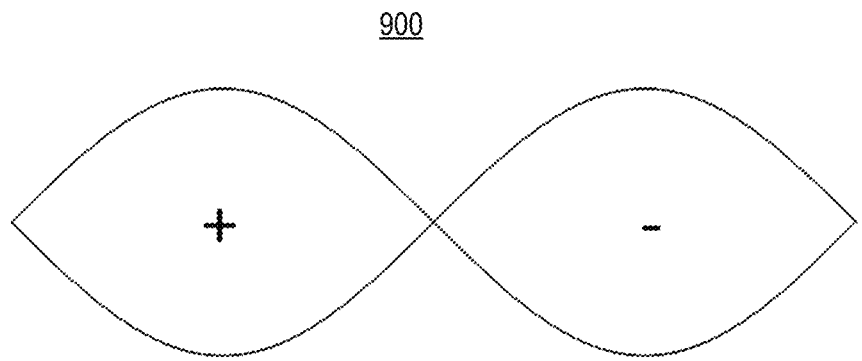
FIG. 9 illustrates an example of an ideal sinusoid.
Figure 10:
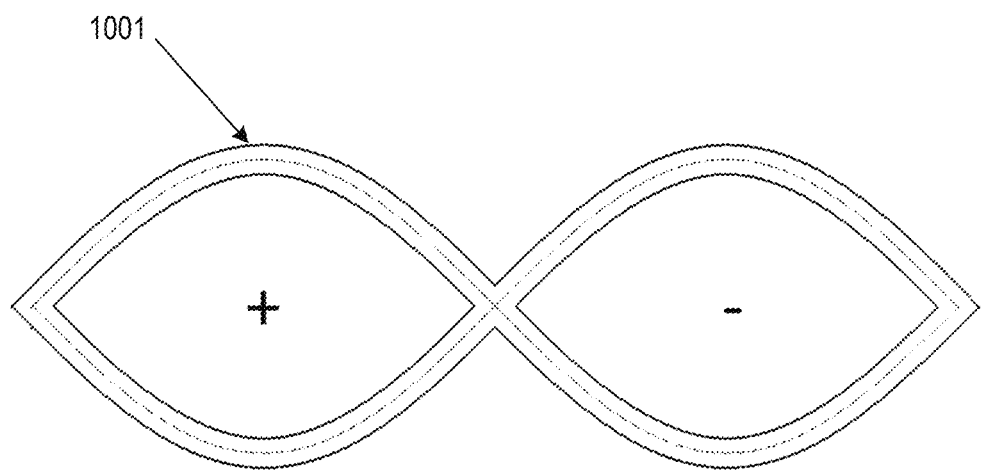
FIG. 10 illustrates an example conductor trace using an ideal sinusoid midline.
Figure 11A:
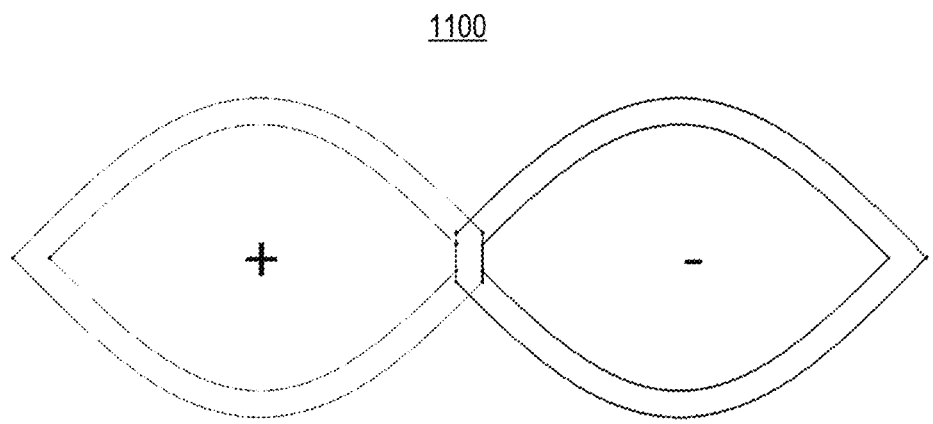
FIG. 11A illustrates an example compensated geometry for conductor trace crossover in accordance with the present disclosure.
Figure 11B:
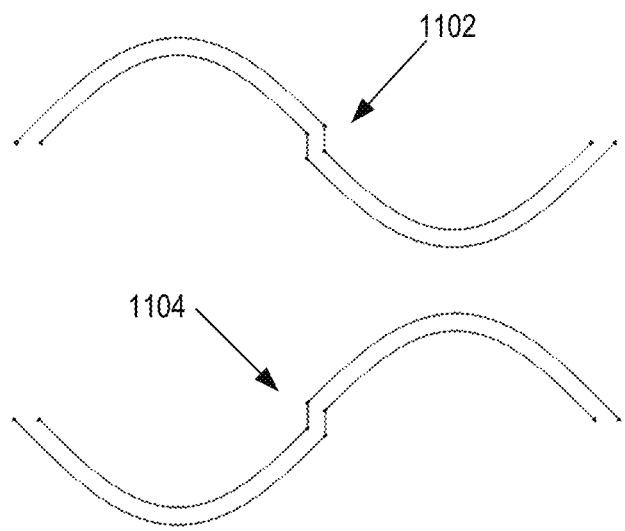
FIG. 11B illustrates the offset traces of FIG. 11A in accordance with an embodiment of the present disclosure.
Figure 12:
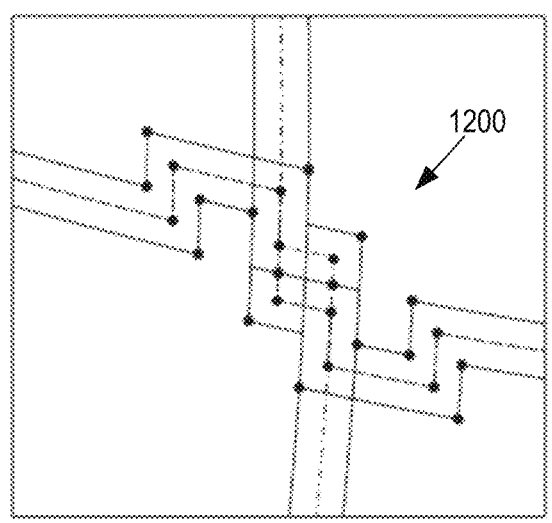
FIG. 12 illustrates an example trace crossover to eliminate dead zones in accordance with an embodiment of the present disclosure.

Using ideal sinusoidal geometry to generate PCB traces, if not considering the trace width of the conductor material, will result in a perfect sinusoidal response as the target travels over the coil loops from the positive loop to the negative loop, as shown by the example ideal sinusoidal geometry (900) depicted in FIG. 9. In the example of FIG. 9, it is assumed that current flowing in a clockwise direction creates a positive loop and current flowing in a counter-clockwise direction creates a negative loop. When a sinusoidal signal in a first loop crosses the midline into the adjacent second loop, the current within the second loop flows in a reverse direction with respect to the first loop. When including the PCB conductor trace width, the positive and negative loops are disjointed, as shown by the conductor trace layout (1001) depicted in FIG. 10. This creates a dead zone at the transition point between the loops that disrupts the sinusoidal output that is desired from the target traveling over the coil resulting in residual errors in the signal. In some embodiments, the traces are offset outward by width of the trace to reduce the amount of error resulting from a dead zone, as shown in the compensated geometry (1100) FIG. 11A. FIG. 11B illustrates the offset traces of FIG. 11A where a first portion (1102) of the geometry (1100) is implemented on one layer of a PCB and a second portion (1104) of the geometry (1100) is implemented on another layer of the PCB. In other embodiments, a dead zone may be substantially eliminated using the crossover geometry (1200) depicted in FIG. 12. Additionally, as previously discussed crossovers between loops and coil sets occur at natural transition points where conductor trace segments intersect, as to not introduce any unintended changes to the sensing area and resulting output signal.

Figure 13:
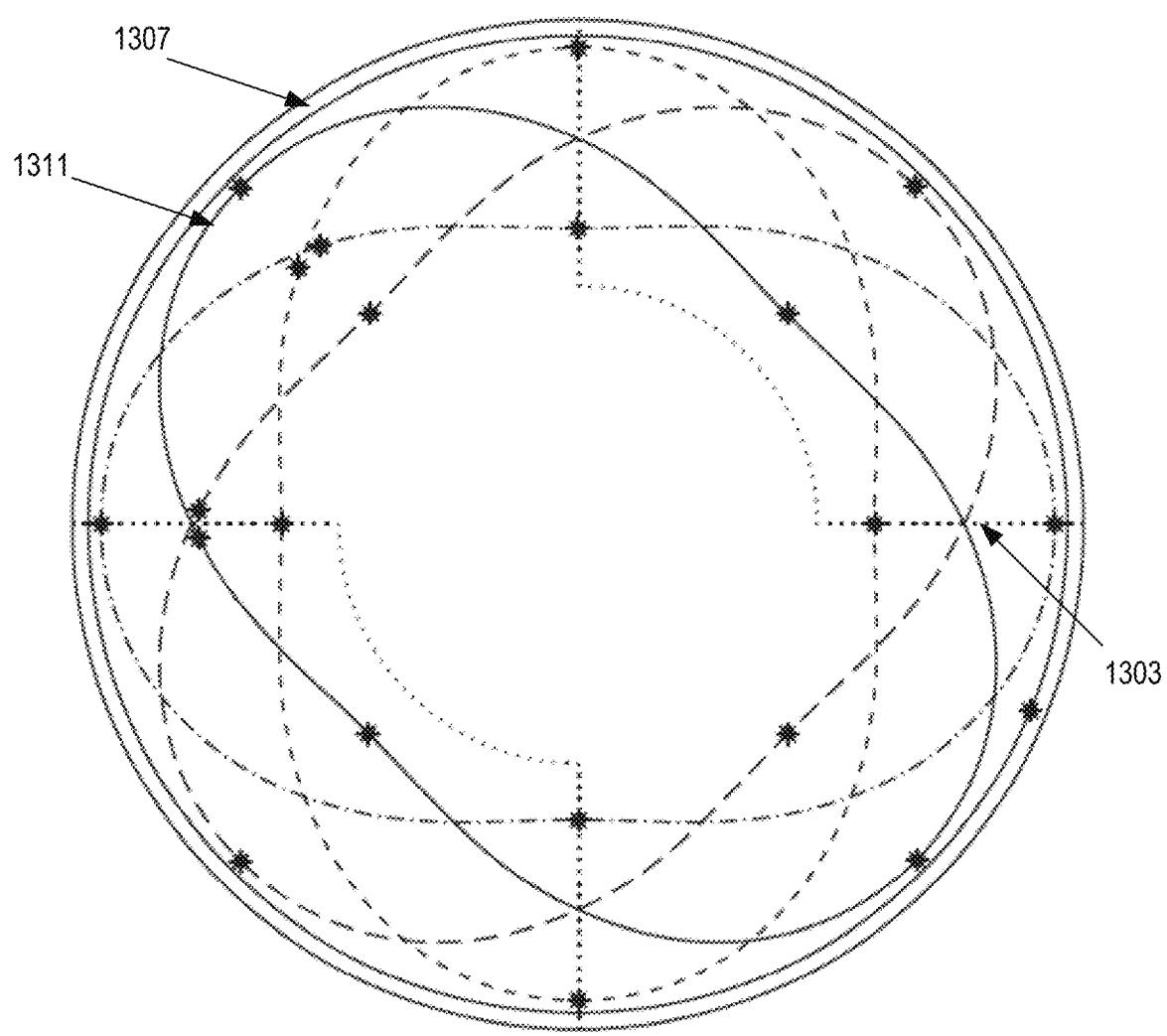
FIG. 13 illustrates an example coil layout and target starting position for a single coil sense element in accordance with embodiments of the present disclosure.
Figure 14:
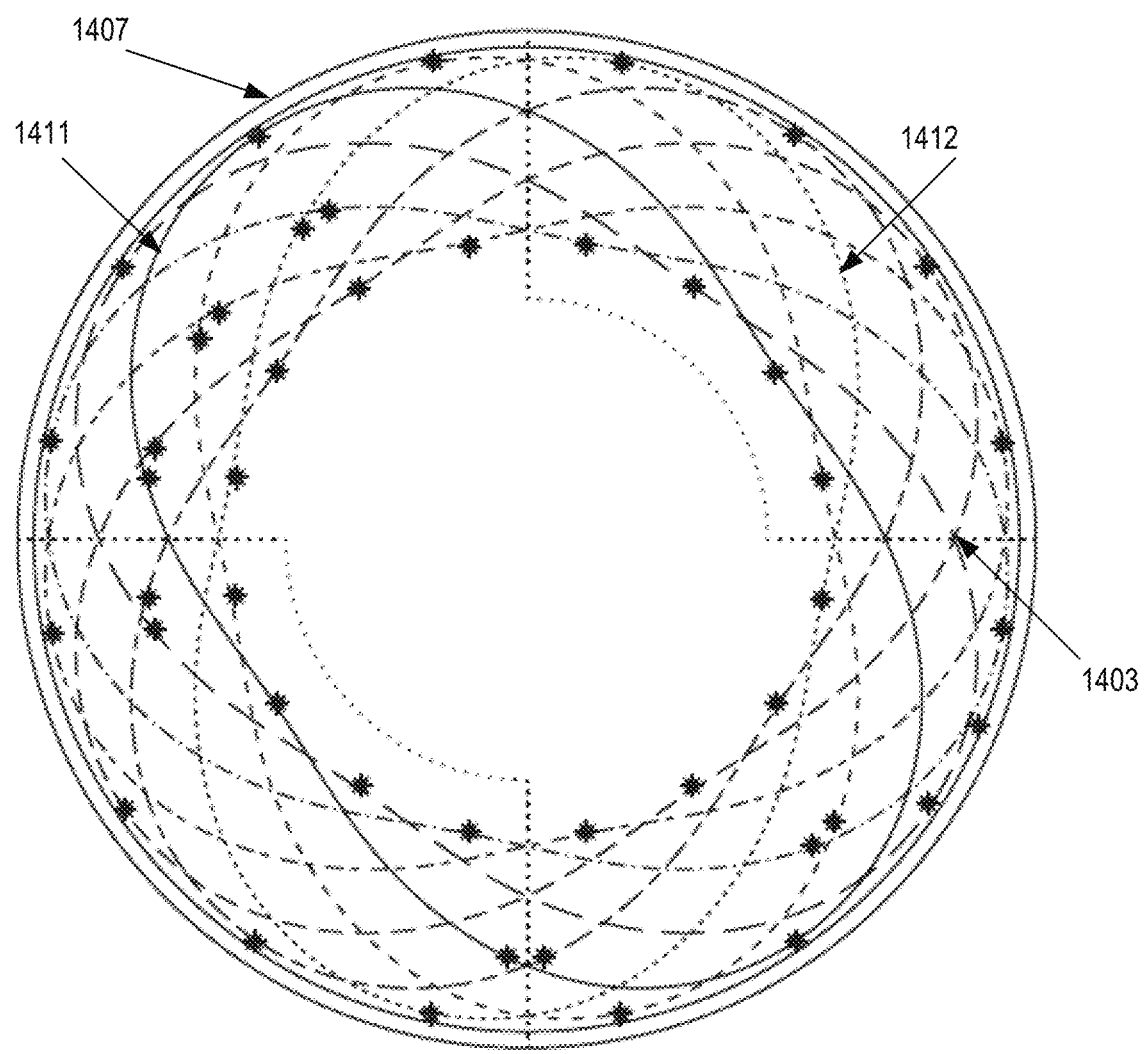
FIG. 14 illustrates an example coil layout and target starting position for a dual coil with 45° phase shift sense element in accordance with embodiments of the present disclosure.

The geometry of the target is also selected to improve the intended signal output. FIG. 13 illustrates an exemplary coil layout (1301) and target (1303) starting position for a single receive coil sense element in accordance with some embodiments of the present disclosure. FIG. 14 illustrates an exemplary coil layout (1401) and target (1403) starting position for a dual receive coil with 45° phase shift sense element in accordance with some embodiments of the present disclosure. As shown in FIGS. 13 and 14, ensuring that the target (1303, 1403) overhangs the receive coils (1311, 1411, 1412) and transmit coils (1307, 1407) improves the output of the sensor. Additionally, the width of a target is conventionally equal to the width of half an electrical period. Whereas, in embodiments in accordance with the present disclosure, the width of the target is selected to be slightly less than half an electrical period to improve robustness against positional offsets. However, when considering the previously described minimization or elimination of dead zones as well as phase shifted coil sets, the target width may be chosen in a manner to minimize the number of dead zones that it will interact with at any given time. For a single coil design this will be smaller than half an electrical cycle by at least the distance covered by a dead zone such that the target cannot be over two dead zones at the same time.

Figure 15:
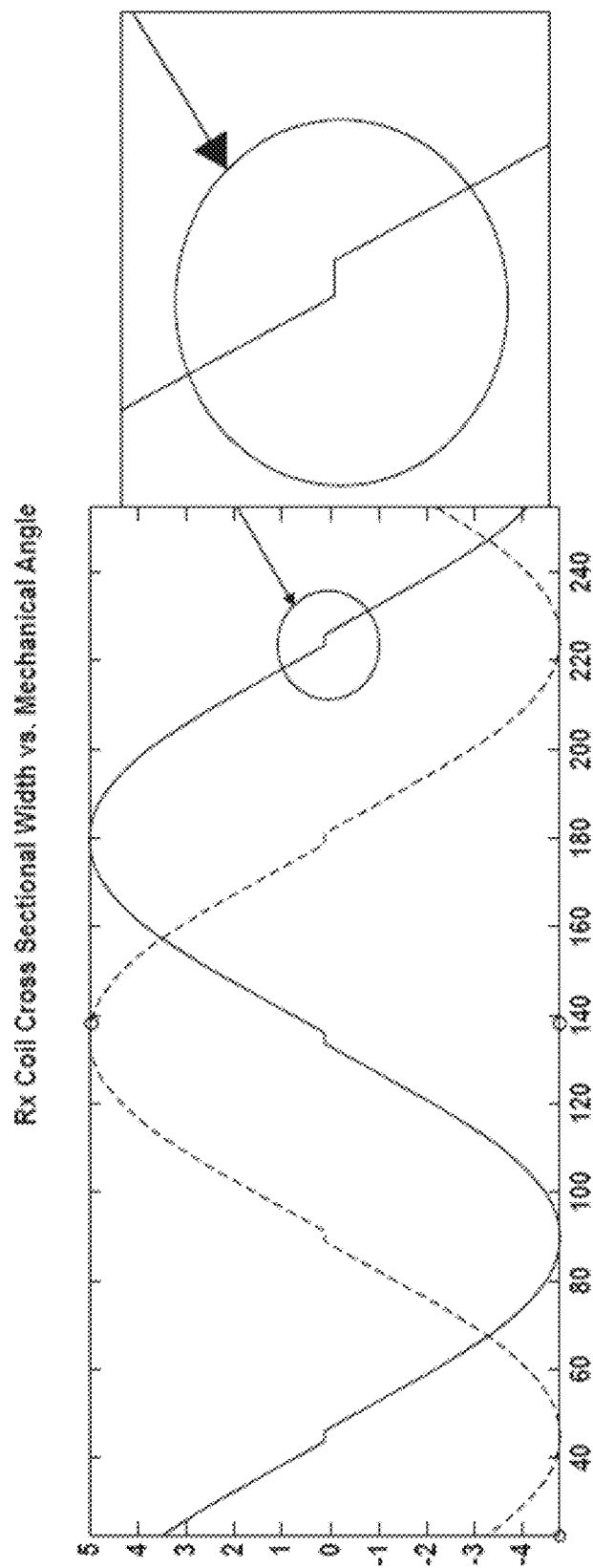
FIG. 15 illustrates a plot of receive coil cross sectional width vs mechanical angle.

FIG. 15 illustrates a plot of receive coil cross sectional width vs. mechanical angle of an example inductive position sensor in accordance with the present disclosure. Plotting the cross sectional width of the coil loops vs. angular position shows four extended zones per electrical cycle that have zero coil width. These dead zones align with where the coil transitions from a positive to a negative loop due to trace width overlap. While the target transitions over these locations, there will be zero change in effected area in one of the receive coils, whereas the other receive coil will be changing at its peak change rate.

Figure 16:
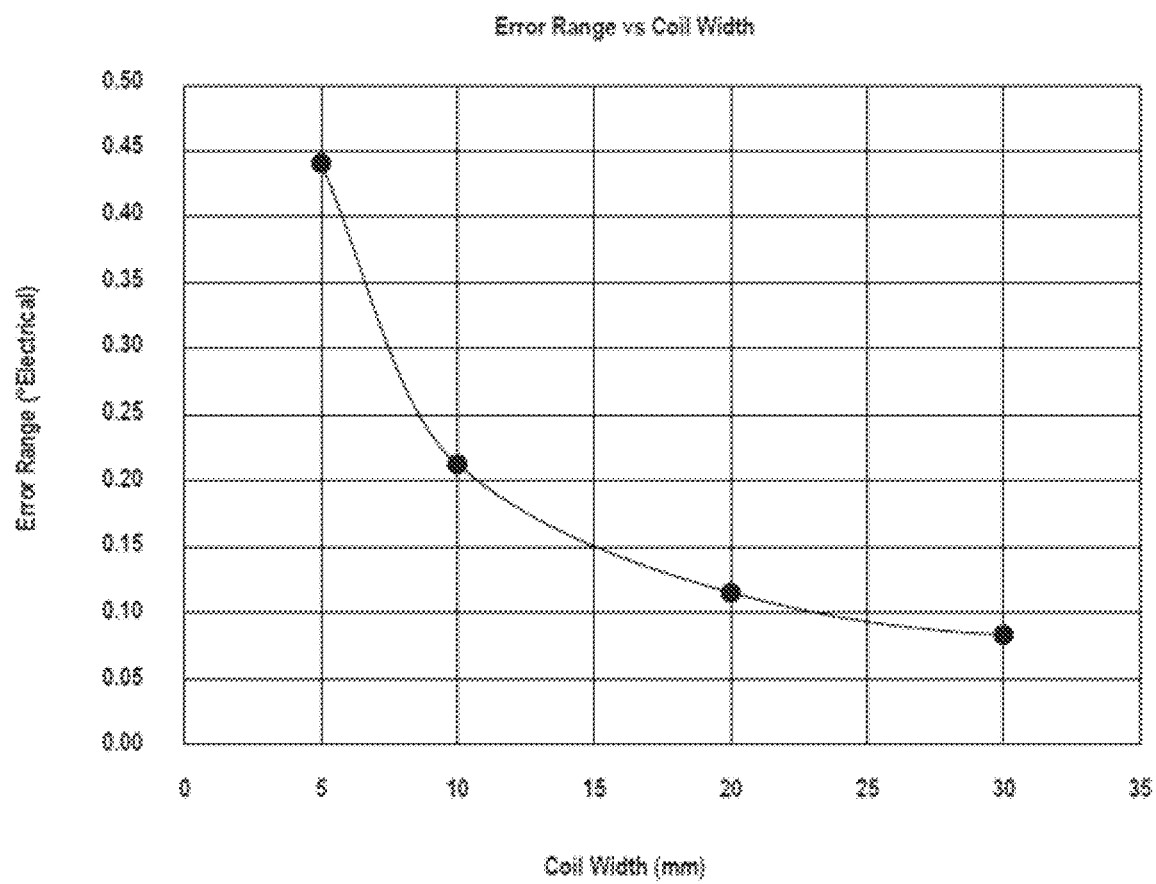
FIG. 16 illustrates a plot of error range (electrical angle) vs. coil width for an example inductive position sensor in accordance with embodiments of the present disclosure.
Figure 17:
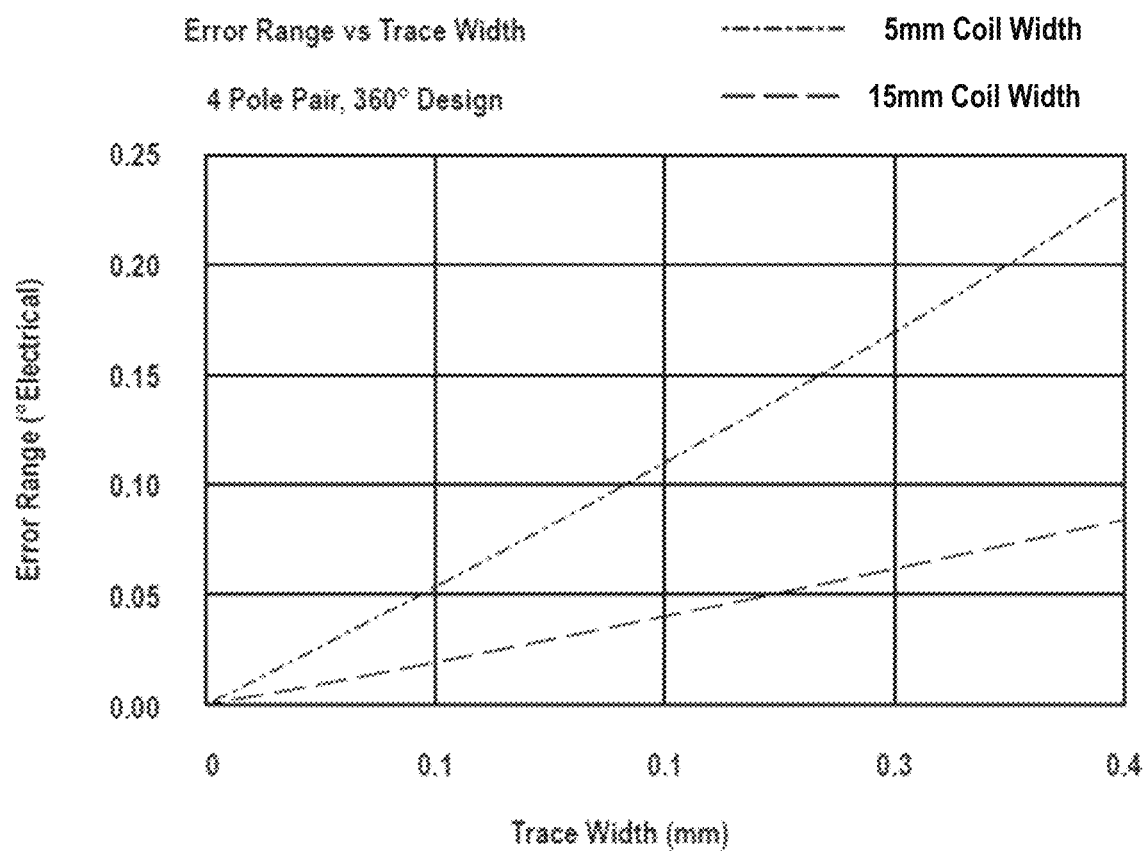
FIG. 17 illustrates a plot of error range (electrical angle) vs. trace width for an example inductive position sensor in accordance with embodiments of the present disclosure.
Figure 18:
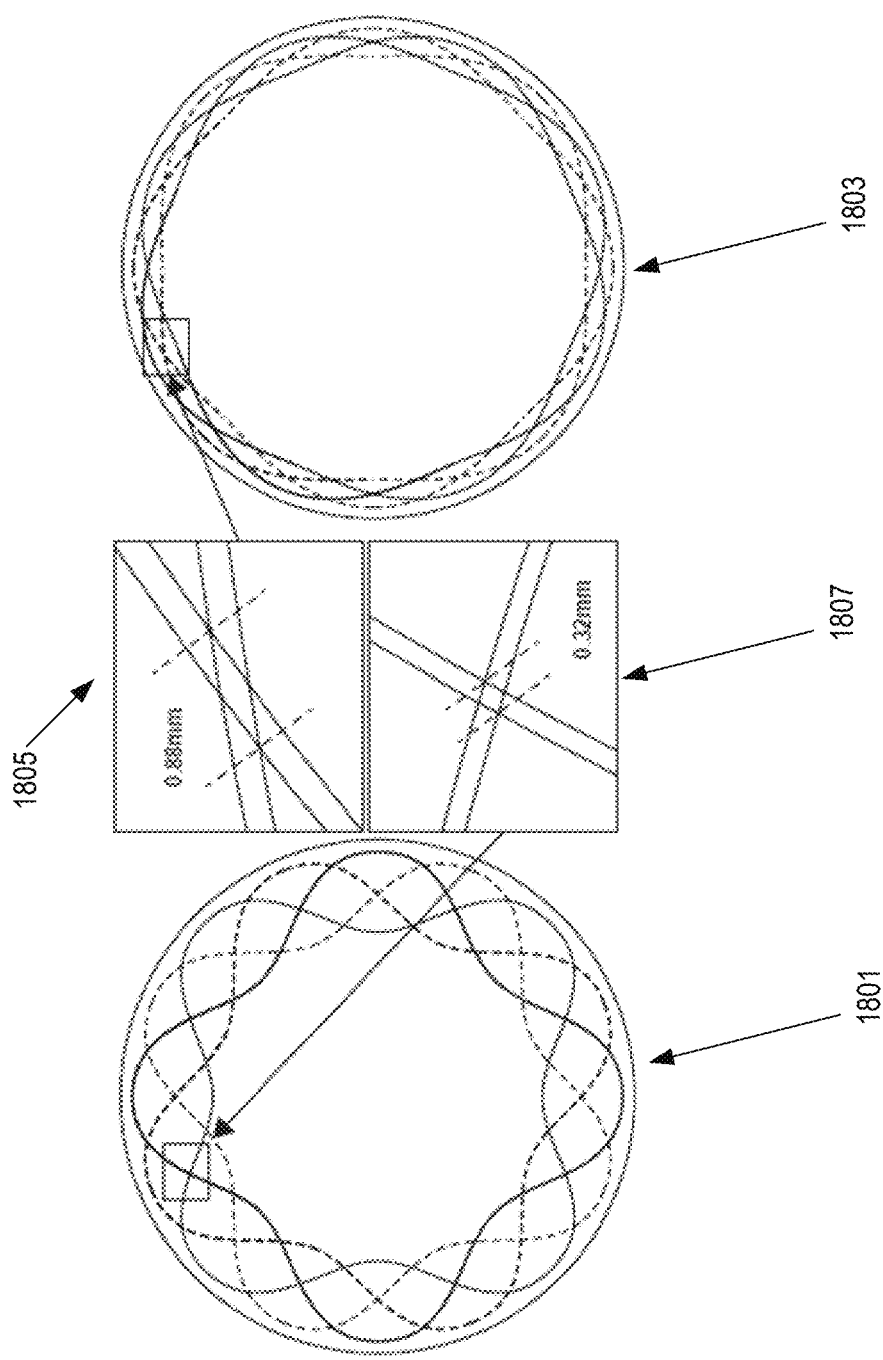
FIG. 18 illustrates crossover width variance with respect to coil width for an example inductive position sensor in accordance with embodiments of the present disclosure.

FIG. 16 illustrates a plot of error range (electrical angle) vs. coil width of an example inductive position sensor in accordance with the present disclosure. FIG. 17 illustrates a plot of error range (electrical angle) vs. trace width for a four pole pair 360 degree design of an example inductive position sensor in accordance with the present disclosure. It can be seen from FIGS. 16 and 17 that the dead zones are dependent on trace and receive coil width. FIG. 18 illustrates that a 15 mm coil (1801) width results in a 0.88 mm crossover region (1807), while a 5 mm coil (1803) width results in a 0.32 mm crossover region (1805).

Figure 19:
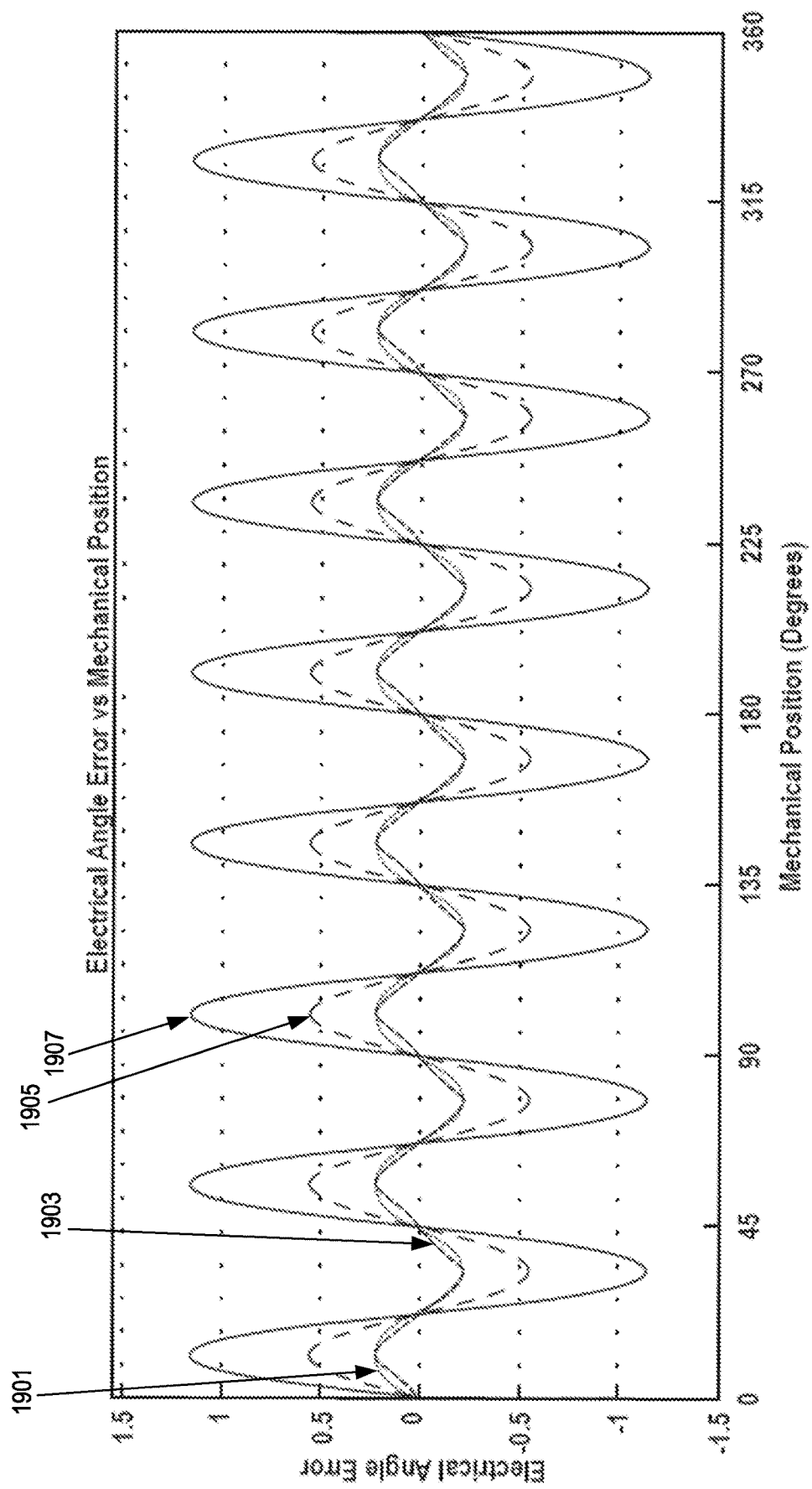
FIG. 19 illustrates a plot of electrical angle vs. mechanical position for an example inductive position sensor in accordance with embodiments of the present disclosure.

As shown in FIG. 19, a two pole pair dual coil design (in accordance with embodiments of the present disclosure decreases the magnitude of periodic error. FIG. 19 illustrates a plot of electrical angle vs. mechanical position for a single receive coil, assessing area only (1901), a single receive coil, assessing area and B-field gradient with 1 transmission coil loop (1907), dual receive coils, assessing area only (1903), and dual receive coils, assessing area and B-field gradient with 1 transmission coil loop (1905).

Figure 20:
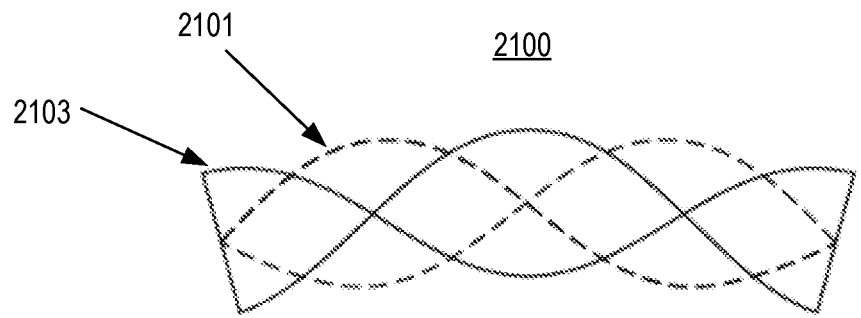
FIG. 20 illustrates an example trace pattern for a receive coil layout in accordance with embodiments of the present disclosure.
Figure 21A:
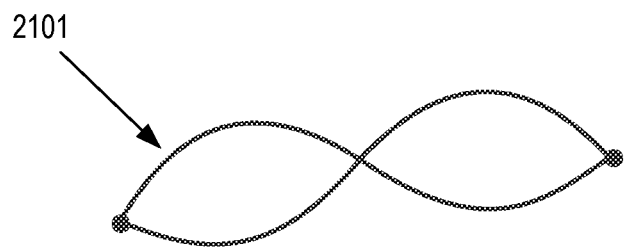
FIG. 21A illustrates an example trace pattern for a first signal in the example of FIG. 20 in accordance with embodiments of the present disclosure.
Figure 21B:
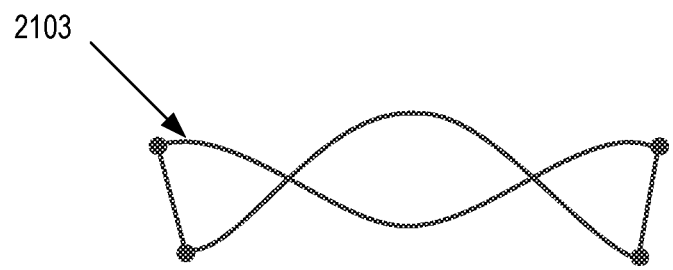
FIG. 21B illustrates an example trace pattern for a second signal in the example of FIG. 20 in accordance with embodiments of the present disclosure.

To increase balance between receive coils and maintain equal inductance the coil patterns should terminate at natural junctions in order to link and close receive loops without requiring trace segments that do not naturally occur within the sinusoidal pattern. In a standard coil this cannot be fully accomplished, as shown in the coil layout (2100) of FIG. 20. With more than one receive coil, only one could ever close at natural junction points. The additional receive coils would require extra trace segments to bridge between end points in the coil pattern. In FIGS. 20A and 20B, the receive coils (2101, 2103) from FIG. 20 are split up to show the difference between a natural closed coil loop and bridged loop that requires extra trace segments to connect and close the coil loop.

In some embodiments in accordance with the present disclosure, to facilitate the use of only closed coils with natural termination, a hanging coil design employed. In these embodiments, a hanging coil has different receive signals physically offset from one another, thus occupying slightly different angular ranges within a given sensor area. For example, a 12 pole pair sensor requires 30° angular space for a full electrical period to exist. As shown in FIG. 20, in a typical inductive position sensor, all receive coils (2101, 2103) would exist only within that 30°.

Figure 22:
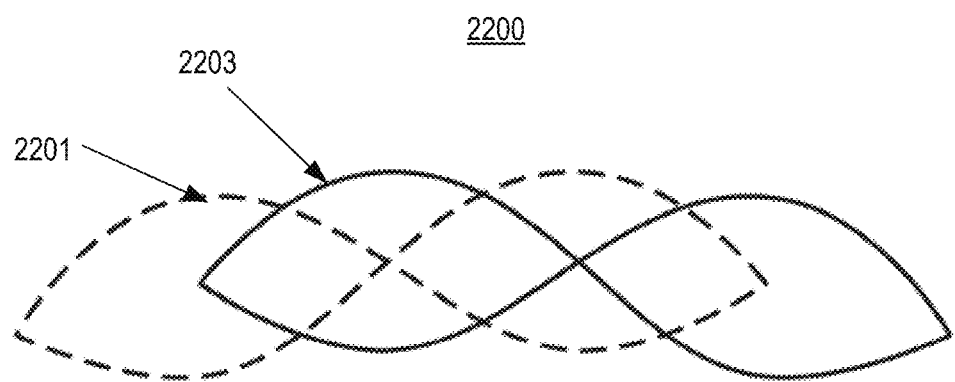
FIG. 22 illustrates an example hanging coil layout in accordance with embodiments of the present disclosure.

For further explanation, FIG. 22 illustrates an example hanging coil layout (2200) in accordance with some embodiments of the present disclosure. In a hanging coil layout, the termination and reflection points of one receive coil are offset from the termination and reflection points of another receive coil. That is, the termination points of one receive coil hangs off one end of an area occupied by both receive coils, and the termination points of the other receive coil hangs off the other end of the area occupied by both receive coils. For example, in FIG. 22, one receive coil (2201) occupies a 0° to 30° range and another coil (2203) occupies a 7.5° to 37.5° range. The hanging coil method provides additional utility for multiloop phase blended coils that have a higher trace density on a PCB. In some form factors it can be difficult to use phase blended coils due to the lack of available space for vias connecting traces between layers. A hanging coil can allow for the vias for one of the receive coils to be outside of the physical space that the other receive coil exists in, thus having lower trace density and more room for the via placement. In some variations, a hanging coil layout may be grouped hanging coil layout such that the termination points (and reflection points) of the angularly arrayed signals in a particular receive coil are aligned (i.e., grouped) along the same angle, where grouping angle of one receive coil is offset by some degrees with respect to the grouping angle of the another receive coil. In some variations, a hanging coil layout may be an individually spaced hanging coil layout such that the termination points (and reflection points) of the angularly arrayed signals in a particular receive coil are individually spaced apart by some degrees. In these variations, the area occupied by the individually spaced termination points (and reflection points) of one first receive coil is offset from an area occupied by the spaced termination points of another receive coil. In some variations, a hanging coil layout may be a split hanging coil layout where termination points of a first set of angularly arrayed signals are split from a second set of angularly arrayed signals by intervening termination points of another receive coil.

Figure 23:
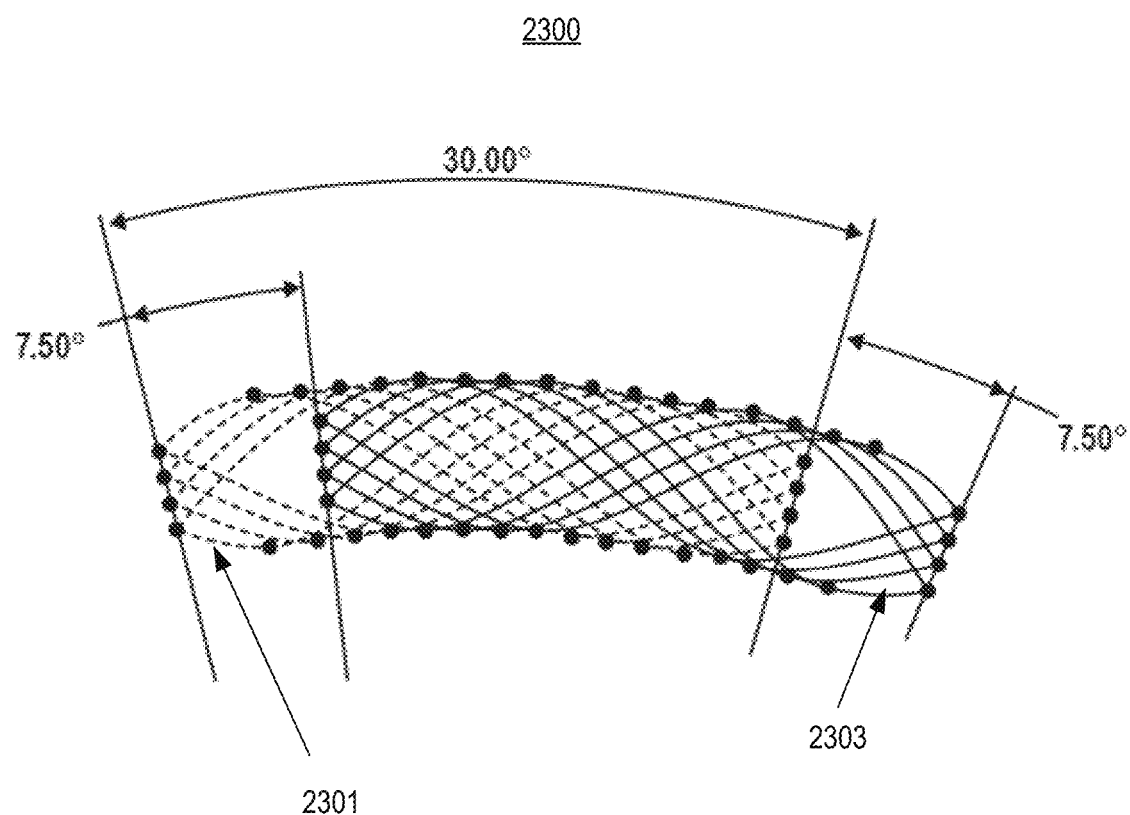
FIG. 23 illustrates example grouped hanging coil layout in accordance with embodiments of the present disclosure.
Figure 24:
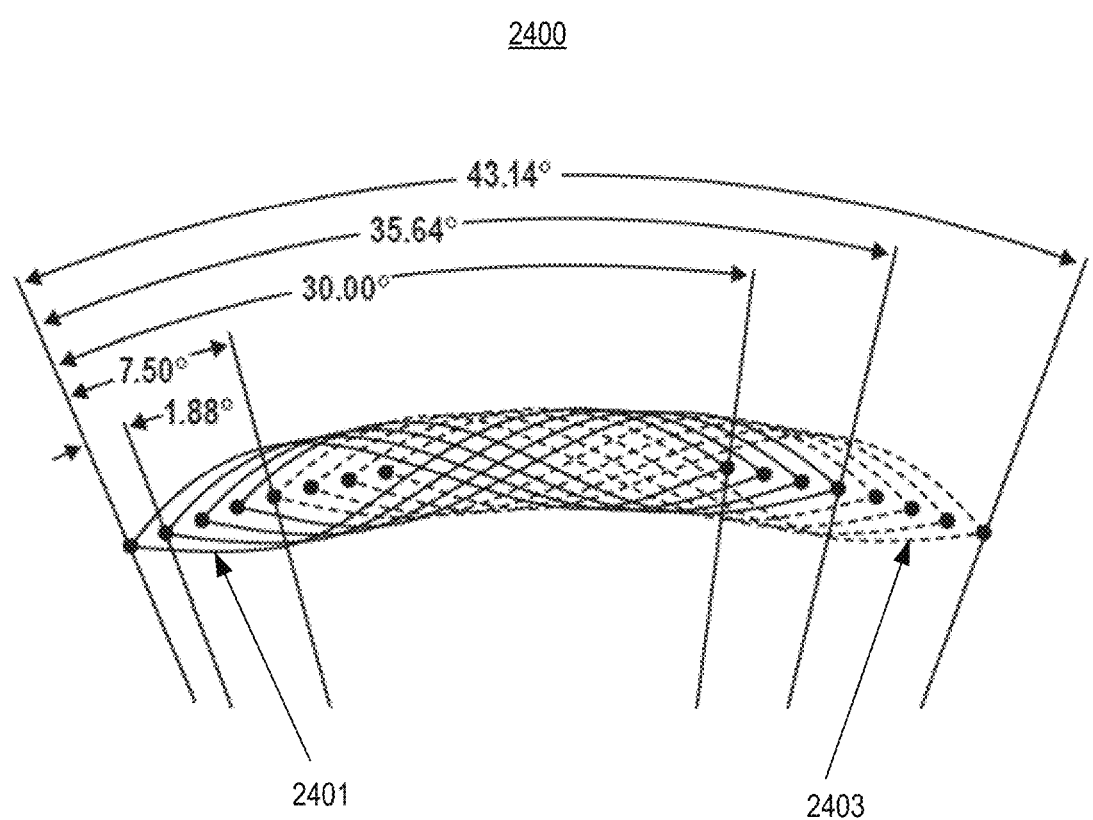
FIG. 24 illustrates example individually spaced hanging coil layout in accordance with embodiments of the present disclosure.

For further explanation, FIG. 23 illustrates an example grouped hanging coil layout (2300) and FIG. 24 illustrates another example individually spaced hanging coil layout (2400) in accordance with some embodiments of the present disclosure. For phase blended multiloop coils there are different ways to employ hanging coil layouts. In some examples, all of the loops for a particular receive coil (2301, 2303) are grouped and terminated together as shown in FIG. 23. In the example of FIG. 23, each receive coil (2301, 2303) occupies a 30° angular range. The termination points of each loop of the receive coil (2301) are grouped such that the loops are terminated along the same angle, which is offset by 7.5° from the angle of the grouped termination points of the receive coil (2303). Thus, the receive coil (2301) "hangs" over the receive coil (2303) on the left side of the coil layout (2300), and the receive coil (2303) hangs over the receive coil (2301) on the right side of the coil layout (2300). In other examples, each individual loop of each receive coil (2401, 2403) are spaced offset from one another as shown in FIG. 24. In the example of FIG. 24, the termination point of each loop in the receive coil (2401) is spaced 1.88° apart, and the termination point of each loop in the receive coil (2403) is spaced 1.88° apart. Each loop of each coil occupies a 30° angular range and each coil (2401, 2403) occupies a 37.5° angular range. The receive coil (2401) hangs over the receive coil (2403) 7.5° on the left and the receive coil (2403) hangs over the receive coil (2401) 7.5° on the right with a total angular range of the layout being 43.14°. Each provide different spacing options that may be better or worse for different applications depending on the size of the sensor, number of PCB layers, manufacturing capabilities, etc. The grouped hanging coils can occupy a smaller angular range than the individually spaced hanging coils, which in general makes it the more cost-effective solution. For example, in a 12 pole pair, four loop, sensor the grouped hanging coil layout (2300) will occupy a total angular range of 37.5°, whereas the individually spaced hanging coil layout (2400) will occupy 43.14°. The individually spaced hanging coil may provide better blending of signal from each loop for each signal and make it more robust to positional offsets.

Figure 25:
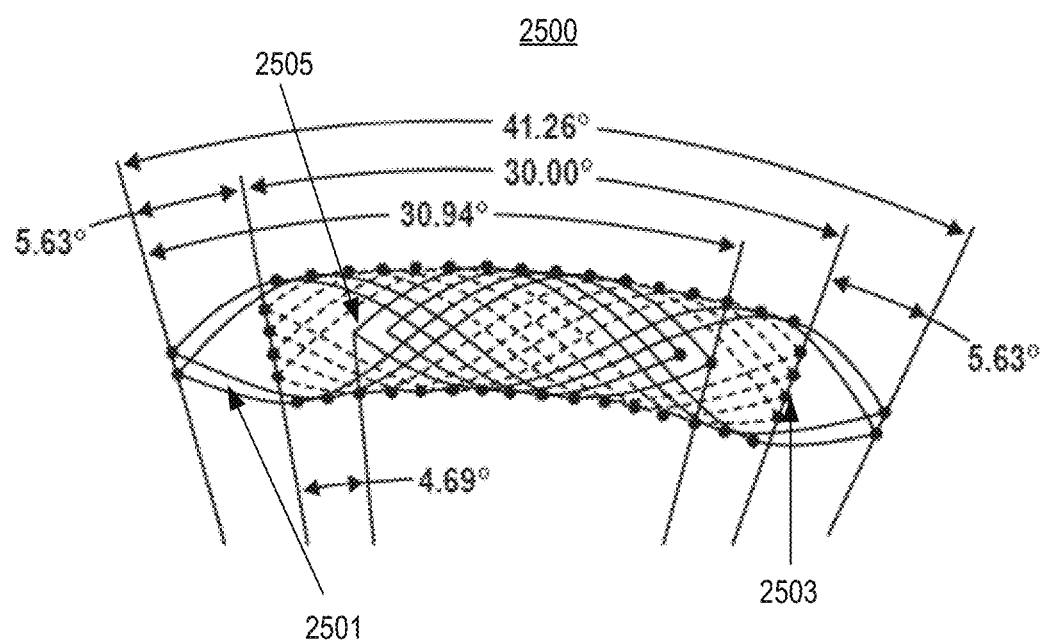
FIG. 25 illustrates a hanging coil layout that is a grouped split hanging coil layout in accordance with embodiments of the present disclosure.

For further explanation, FIG. 25 illustrates another example hanging coil layout (2500) that is a grouped split hanging coil layout in accordance with some embodiments of the present disclosure. Hanging coils can result in imbalances due to sensor and/or target positional offsets. To improve performance under these conditions a hanging coil can be split to have one of the receive signals partially hang off of both ends of an arc sensor. In the example of FIG. 25, a first receive coil (shown in solid lines) is split such that a portion (2501) of the receive coil occupying a 41.26° angular range overhangs a second receive coil (2503) (shown in dashed lines) occupying a 30° angular range by 5.63°. The second receive coil (2503) overhangs a second portion (2505) of the first receive coil by 4.69°. That is, in the example of FIG. 25, one receive coil (dashed lines) has have all four of its loops occupying a 30° range, while the other receive coil (solid lines) has two of its loops hanging from −5.63° to 25.3° and its other two hanging from 4.69° to 35.63°. This layout decreases the trace density enough in the areas where vias are required, but also provides additional coil balance by splitting the receive coil that is at either end of the sensing region, which provides engagement with more target wings at once and offers some amount of balance for positional offsets. The grouped split hanging coil layout is suitable in coil designs that phase blend a positive number of coil loops.

Figure 26:
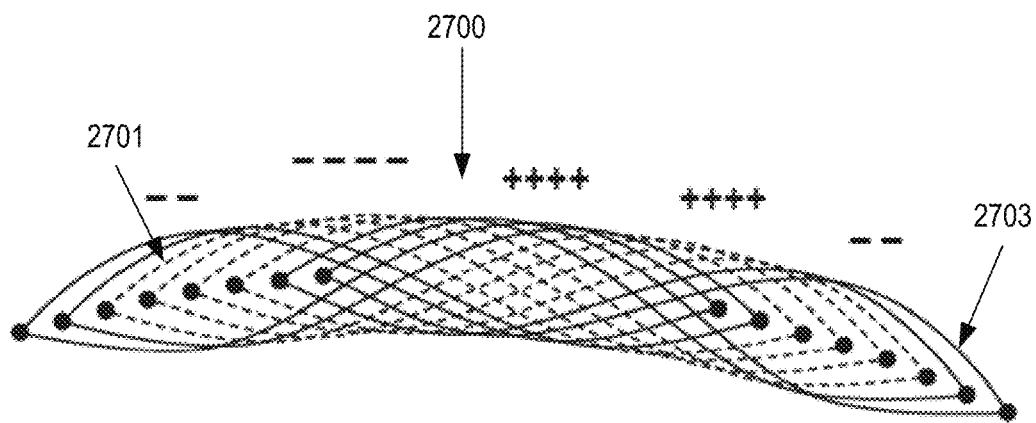
FIG. 26 illustrates a hanging coil layout that is an individually spaced split hanging coil layout in accordance with embodiments of the present disclosure.
Figure 27A:
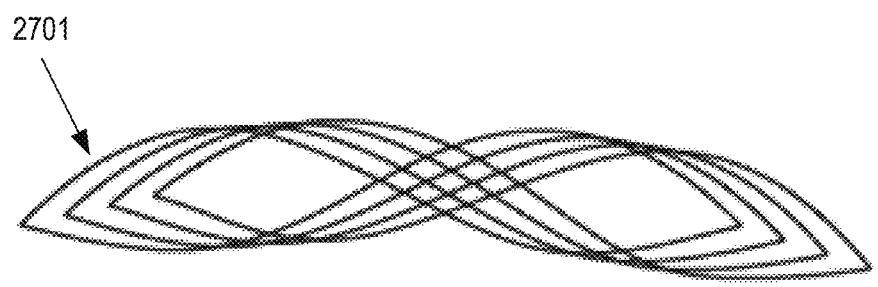
FIG. 27A illustrates one pattern of the hanging coil layout of FIG. 26.
Figure 27B:
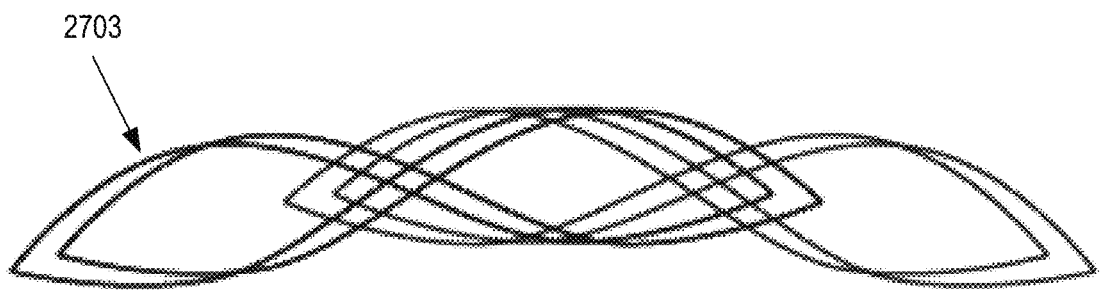
FIG. 27B illustrates another pattern of the hanging coil layout of FIG. 26.

For further explanation, FIG. 26 illustrates an example hanging coil layout (2700) that is an individually spaced split hanging coil layout, with each receive coil (2701, 2703) shown separately in FIGS. 27A and 27B. In these examples, loops of the receive coil (2701) are split such that two loops of the receive coil (2701) overhang the receive coil (2703) on the left and two loops of the receive coil (2701) overhang the receive coil (2703) on the right. The loops of the receive coil (2701) are individually spaced apart, and the loops of the receive coil (2703) are individually spaced apart. This creates four negative loops and four positive loops of the coil (2703) and four positive loops of the coil (2701) that are bounded by two negative loops of the coil (2701). These examples use a single electrical period sensor, however the utility of this layout is not limited to only single electrical period coils. Hanging coil layouts can be employed on any arc sensor regardless of the number of electrical periods or poles.

In the above examples, vias are located at natural transition points of line segments, and thus would typically be located at the midline of the curves. In some applications, there are space constraints that will not allow for optimizing coil width and via placement. However, due to the size of vias, the location of transition points must be at a certain minimum radial position on the board. To maintain this position and still optimize coil loop area an asymmetric coil is employed.

Figure 28A:
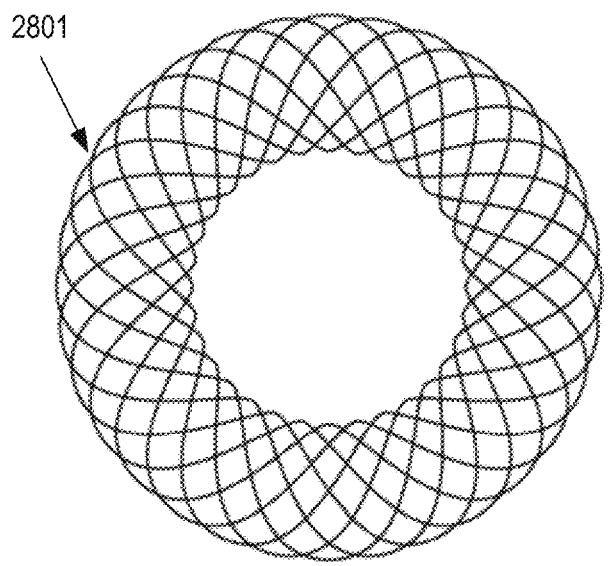
FIG. 28A illustrates an example symmetric coil pattern in accordance with the present disclosure.
Figure 28B:
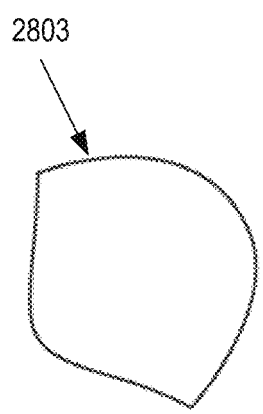
FIG. 28B illustrates an example loop shape of the symmetric coil pattern of FIG. 28A.

FIG. 28A illustrates an example symmetric coil pattern (2801) in accordance with the present disclosure. FIG. 28B illustrates an example loop shape (2803) of the symmetric coil pattern of FIG. 28A. In applications with high trace density it is possible to optimize coil area and via placement by having asymmetric coil widths. An inductive position sensor may employ sinusoidal trace layouts to generate the sinusoidal response from the target. These layouts may be created by having a sinusoidal trace geometry and its reflection about the midline of the sensing area. This creates a sinusoidal response that is twice the amplitude of the base coil trace geometry. In designs that utilize natural transition points for trace routing, the coil geometry defines the via placements radial position. The greater the radial position, the more area that is available for via placement. With high trace density it is important to have vias as far out radially as possible, but this is limited if the ID is too small and the resulting transition points are moved inward.

Figure 29A:
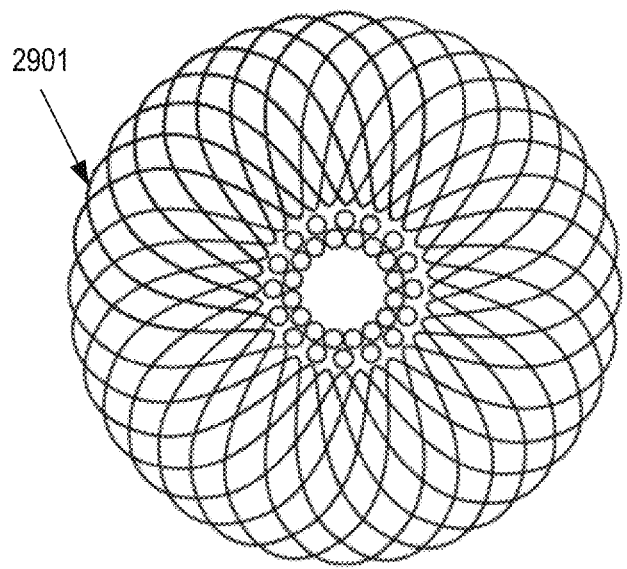
FIG. 29A illustrates an example asymmetric coil pattern in accordance with the present disclosure.
Figure 29B:
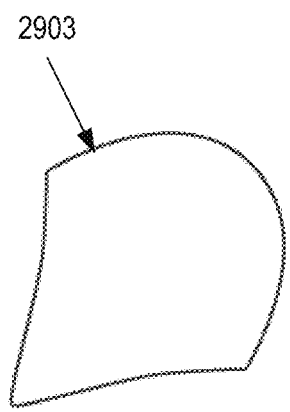
FIG. 29B illustrates an example loop shape of the asymmetric coil pattern of FIG. 29A.
Figure 30:
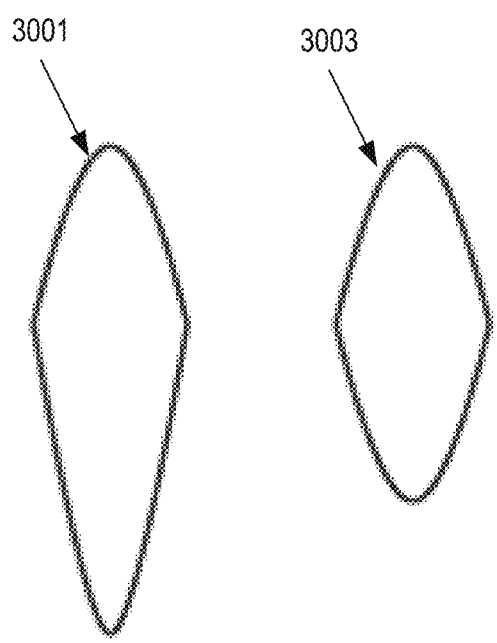
FIG. 30 illustrates a symmetric loop shape and an asymmetric loop shape in accordance with the present disclosure on a linear scale.

For further explanation, FIG. 29A illustrates an example asymmetric coil pattern (2901) in accordance with the present disclosure. FIG. 29B illustrates an example loop shape (2903) of the asymmetric coil pattern of FIG. 29A. To keep the transition points further out, the coil design can use two different amplitudes to generate the coil geometry. The resulting sinusoid then has an amplitude A=A1+A2. This allows for a greater overall coil width by having A2 greater than A1, but keep the vias located where they would have been with a smaller coil width and larger midline radius. The resulting greater coil sense area increase the signal amplitude of the sensor. FIG. 30 illustrates a symmetric loop shape (3003) and an asymmetric loop shape (3001) in accordance with the present disclosure on a linear scale.

For further explanation, FIG. 31 sets forth a flow char illustrating an example method for an inductive position sensor in accordance with an embodiment of the present disclosure. The method of FIG. 31 includes providing (3110) a sense element comprising at least one transmit coil; a first receive coil that includes a first plurality of arrayed loops, wherein two or more of the first plurality of arrayed loops are at least one of phase blended and amplitude arrayed; and a second receive coil that includes a second plurality of arrayed loops, wherein two or more of the second plurality of arrayed loops are at least one of phase blended and amplitude arrayed, and wherein the first receive coil and the second receive coil are phase shifted. In some example, providing (3110) a sense element is carried out by providing an inductive position sensor having an arrayed receive coil layout such as the receive coil layouts described with reference to FIGS. 1-5, 6A, 6B, 7A, 8, 13, 14, 18, 22-26, 27A, 28A, and 29A.

The example method of FIG. 31 also includes driving (3120) the at least one transmit coil. In some example, driving (3120) the at least one transit coil includes driving the at least one transmit coil with a signal in parallel with a capacitor to generate a magnetic field that is the transmitted signal to the receive coils.

The example method of FIG. 31 also includes detecting (3130) a first reference signal in the first receive coil and detecting (3140) a second reference signal in the second receive coil. In some examples, detecting (3130) a first reference signal in the first receive coil and detecting (3140) a second reference signal in the second receive coil is carried out by an integrated circuit that detects the voltage in the first receive coil and the second receive coil induced by the magnetic field generated by the signal transmitted by the transmit coil.

The example method of FIG. 31 also includes determining (3150) a position of a conductive target in proximity of the sense element based on a change in the first reference signal and the second reference signal. In some examples, determining (3150) a position of a conductive target in proximity of the sense element based on a change in the first reference signal and the second reference signal is carried out by the integrated circuit determining the action of the first reference signal and the second reference signal. When the sense element includes an angularly or linearly arrayed (X-arrayed) coil layout, a phase blended first reference signal is summed and correlated to the mean position of the coil loops and a phase blended second reference signal is summed and correlated to the mean position of the coil loops. When the sense element includes a radially or linearly arrayed (Y-arrayed) coil layout, phase aligned signals are amplitude summed.

In view of the explanations set forth above, readers will recognize that the benefits the phase blended, arrayed, multiloop inductive coils with layout compensated geometry include increased signal strength on receive coils of an inductive position sensor, providing the purest intended sinusoidal response signal for optimal sensor performance, allowing functionality and maintain signal quality in broad range of form factors and application requirements, and decreased susceptibility to sensor and system variable's tolerance ranges and stacks. By increasing the signal strength in the receive coils, the signal to noise ratio may be increased, thresholds for proper signal conditioning can be met, and sensor sensitivity to target position under all application conditions (e.g., airgap and temperature ranges) can be improved.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. An inductive position sensor comprising:
   a sense element comprising:
     at least one transmit coil;
     a first receive coil that includes a first plurality of arrayed loops having two or more arrayed loop sets, wherein the two or more arrayed loop sets are at least one of phase arrayed and amplitude arrayed; and
     a second receive coil that includes a second plurality of arrayed loops having two or more arrayed loop sets, wherein the two or more arrayed loop sets are at least one of phase arrayed and amplitude arrayed, and wherein the first receive coil and the second receive coil are phase shifted;
   a conductive target; and
   an integrated circuit configured to:
     provide a transmission signal to the at least one transmit coil;
     detect a first reference signal in the first receive coil;
     detect a second reference signal in the second receive coil; and
     detect a position of the conductive target based on change in the first reference signal and the second reference signal.

2. The sensor of claim 1, wherein a particular loop in the first plurality of arrayed loops includes a first trace pattern in a first conductive layer, a second trace pattern in a second conductive layer, and a plurality of vias connecting the first trace pattern and the second trace pattern; and wherein via pads corresponding to vias are located outside of an intended sensing area of the particular loop.

3. The sensor of claim 1, wherein a layout of a trace pattern for a particular loop is biased such that an edge of the trace pattern adjacent an intended sensing area is used as a signal reference.

4. The sensor of claim 1, wherein a trace pattern geometry for the first plurality of arrayed loops and the second plurality of arrayed loops is compensated for a dead zone at an intersection of two loops.

5. The sensor of claim 1, wherein a particular loop in the first plurality of arrayed loops includes a first trace pattern in a first conductive layer, a second trace pattern in a second conductive layer; and wherein the first conductive layer and the second conductive layer are composed of conductive ink on printed film.

6. The sensor of claim 1, wherein crossovers between trace segments in the first receive coil and the second receive coil occur at natural transition points where conductor traces intersect.

7. The sensor of claim 1,
wherein the two or more arrayed loop sets of the first receive coil includes a first set of loops that is angularly arrayed with respect to a second set of loops and a third set of loops that is radially arrayed with respect to the second set of loops.

8. The sensor of claim 1 wherein the first receive coil and the second receive coil are arranged in a hanging coil layout.

9. The sensor of claim 8, wherein the hanging coil layout is a grouped hanging coil layout.

10. The sensor of claim 8, wherein the hanging coil layout is an individually spaced hanging coil layout.

11. The sensor of claim 8, wherein the hanging coil layout is a split hanging coil layout.

12. The sensor of claim 1, wherein the target is selected to be less than half an electrical period of the sensor.

13. A sense element for an inductive position sensor, the sense element comprising:
at least one transmit coil;
a first receive coil that includes a first plurality of arrayed loops having two or more arrayed loop sets, wherein the two or more arrayed loop sets are at least one of phase arrayed and amplitude arrayed; and
a second receive coil that includes a second plurality of arrayed loops having two or more arrayed loop sets, wherein the two or more arrayed loop sets are at least one of phase arrayed and amplitude arrayed, and wherein the first receive coil and the second receive coil are phase shifted.

14. The sense element of claim 13, wherein a particular loop in the first plurality of arrayed loops includes a first trace pattern in a first conductive layer, a second trace pattern in a second conductive layer, and a plurality of vias connecting the first trace pattern and the second trace pattern; and wherein via pads corresponding to vias are located outside of an intended sensing area of the particular loop.

15. The sense element of claim 13, wherein a layout of a trace pattern for a particular loop is biased such that an edge of the trace pattern adjacent an intended sensing area is used as a signal reference.

16. The sense element of claim 13, wherein a trace pattern geometry for the first plurality of arrayed loops and the second plurality of arrayed loops is compensated for a dead zone at an intersection of two loops.

17. The sense element of claim 13, wherein a particular loop in the first plurality of arrayed loops includes a first trace pattern in a first conductive layer, a second trace pattern in a second conductive layer; and wherein the first conductive layer and the second conductive layer are composed of conductive ink on printed film.

18. The sense element of claim 13, wherein the first receive coil and the second receive coil are arranged in a hanging coil layout.

19. A method for an inductive position sensor, the method comprising:
providing a sense element comprising:
at least one transmit coil;
a first receive coil that includes a first plurality of arrayed loops having two or more arrayed loop sets, wherein the two or more arrayed loop sets are at least one of phase arrayed and amplitude arrayed; and
a second receive coil that includes a second plurality of arrayed loops having two or more arrayed loop sets, wherein the two or more arrayed loop sets are at least one of phase arrayed and amplitude arrayed, and wherein the first receive coil and the second receive coil are phase shifted;
driving, by an integrated circuit, a transmission signal to the at least one transmit coil;
detecting, by the integrated circuit, a first reference signal in the first receive coil;
detecting, by the integrated circuit, a second reference signal in the second receive coil; and
determining, by the integrated circuit, a position of a conductive target in proximity of the sense element based on a change in the first reference signal and the second reference signal.

20. The sensor of claim 1, wherein a coil having phase arrayed loop sets includes two or more loop sets that are angularly arrayed in a 360° sensor or arc sensor, or x-axis arrayed in a linear sensor; and a coil having amplitude arrayed loop sets includes two or more loop sets that are radially arrayed in a 360° sensor or arc sensor, or y-axis arrayed in a linear sensor.

* * * * *